(12) United States Patent
Kitazawa et al.

(10) Patent No.: US 8,830,551 B2
(45) Date of Patent: Sep. 9, 2014

(54) ACTUATOR, PROTECTIVE COVER FOR ACTUATOR, ACTUATOR MANUFACTURING METHOD, AND OPTICAL DEFLECTOR INCORPORATING ACTUATOR, AND TWO DIMENSIONAL OPTICAL SCANNER AND IMAGE PROJECTOR INCORPORATING OPTICAL SCANNER

(75) Inventors: Tomofumi Kitazawa, Kawasaki (JP); Goichi Akanuma, Yokohama (JP); Mitsumi Fujii, Sendai (JP)

(73) Assignee: Ricoh Company, Ltd., Tokyo (JP)

( * ) Notice: Subject to any disclaimer, the term of this patent is extended or adjusted under 35 U.S.C. 154(b) by 161 days.

(21) Appl. No.: 13/280,781

(22) Filed: Oct. 25, 2011

(65) Prior Publication Data

US 2012/0120470 A1 May 17, 2012

(30) Foreign Application Priority Data

Nov. 16, 2010 (JP) .................................. 2010-255490
Aug. 30, 2011 (JP) .................................. 2011-186951

(51) Int. Cl.
*G02B 26/10* (2006.01)
*H02N 1/00* (2006.01)
*G02B 26/08* (2006.01)

(52) U.S. Cl.
CPC ............ *G02B 26/0858* (2013.01); *H02N 1/006* (2013.01); *G02B 26/0833* (2013.01); *Y10S 359/904* (2013.01)
USPC ....................... 359/224.1; 359/200.8; 359/904

(58) Field of Classification Search
CPC ............ G02B 6/3518; G02B 26/0833; G02B 26/0841; G02B 26/085; G02B 26/0858; G02B 26/0866; B81B 3/0045; B81B 3/0048; B81B 3/0051; B81B 3/0078; B81B 2201/04; B81B 2201/042; B81B 2201/045; B81B 2201/047
USPC .......... 359/198.1–199.4, 200.6–200.8, 202.1, 359/221.2, 223.1–225.1, 226.2, 904, 359/290–295, 838, 846, 871, 872, 359/200.1–200.2, 221.3–221.4; 250/204, 250/559.06, 559.29, 230, 234; 347/255–260; 353/39, 98–99; 385/15–18, 22; 398/12, 19, 45

See application file for complete search history.

(56) References Cited

U.S. PATENT DOCUMENTS 4,427,811 A * 1/1984 Elias et al. ...................... 524/96
6,392,220 B1 * 5/2002 Slater et al. ................... 250/216

(Continued)

FOREIGN PATENT DOCUMENTS

| CN | 1957283 A | 5/2004 |
| JP | 2003-181800 | 7/2003 |
| JP | 2004-304856 | 10/2004 |
| JP | 2006-201678 | 8/2006 |

(Continued)

OTHER PUBLICATIONS

Chinese Office Action issued in corresponding application No. 201110372138.0 on Dec. 25, 2013 (w/ English Translation).

*Primary Examiner* — Stephone B Allen
*Assistant Examiner* — James McGee
(74) *Attorney, Agent, or Firm* — Oblon, Spivak, McClelland, Maier & Neustadt, L.L.P.

(57) ABSTRACT

An actuator is configured of a frame element, a pair of beam elements, a movable element rotatably supported by the frame element via the beam elements, a driver configured to rotate the movable element relative to the frame element around the beam elements as a rotary shaft; and damper elements provided on the rotary axis of the beam elements.

17 Claims, 26 Drawing Sheets

(56) References Cited

U.S. PATENT DOCUMENTS

2007/0014512 A1* 1/2007 Turner ............................ 385/18
2010/0195180 A1 8/2010 Akanuma et al.
2010/0309536 A1 12/2010 Akanuma et al.

FOREIGN PATENT DOCUMENTS

| JP | 2010-008609 | 1/2010 |
| JP | 2010-148265 | 7/2010 |
| WO | 2005/094535 A2 | 10/2005 |

* cited by examiner

ACTUATOR, PROTECTIVE COVER FOR ACTUATOR, ACTUATOR MANUFACTURING METHOD, AND OPTICAL DEFLECTOR INCORPORATING ACTUATOR, AND TWO DIMENSIONAL OPTICAL SCANNER AND IMAGE PROJECTOR INCORPORATING OPTICAL SCANNER

CROSS REFERENCE TO RELATED APPLICATION

The present application is based on and claims priority from Japanese Patent Application No. 2010-255490, filed on Nov. 16, 2010 and No. 2011-186951, filed on Aug. 30, 2011, the disclosure of which is hereby incorporated by reference in its entirety.

BACKGROUND OF THE INVENTION

1. Field of the Invention

The present invention relates to an actuator, a protective cover for actuator, an actuator manufacturing method, and an optical deflector incorporating the actuator, and a two dimensional optical scanner and an image projector incorporating the optical deflector.

2. Description of the Prior Art

An actuator manufactured by micromachine technology (MEMS) has been improved in terms of power saving, down-sizing, high-speed operation. A driver for the actuator made of a silicon wafer can be mass-produced at low price by semiconductor microfabrication technique.

FIG. 1 shows an example of such an actuator. In FIG. 1 an actuator 30 includes a rectangular frame element 31, a pair of beam elements (torsion bar) 32 as a rotary shaft, and a movable element 33. The pair of beam elements is attached to the frame element 31, and the movable element 33 is supported by the frame element 31 via the beam elements 32. A mirror face 33a, for example is formed on the movable element 33.

In the actuator 30 the movable element 33 is rotated by torsion of the beam elements as shown in FIGS. 2, 3. This actuator 30 can generate rotary oscillation at high speed with large amplitude by use of small energy from resonance.

Moreover, Japanese Patent Application Publication No. 2003-181800 discloses such an actuator 30 which includes meander beam elements 34 consisting of turnback portions 34a and straight portions 34b, and piezoelectric films formed on the meander beam elements as shown in FIGS. 4, 5, for example. This actuator with low spring stiffness can be largely inclined by alternatively bending neighboring straight portions 34b of the beam elements 32 in opposite directions.

That is, by providing the meander beam elements in the frame element 31, the actuator 30 can have a spring system equivalent to one made of a long straight torsion without an increase in the size of the frame element 31. Therefore, the spring stiffness of the beam elements can be lowered and the resonance frequency of the spring system can be lowered in low-speed operation. The actuator can be largely rotated by a small driving force even with no use of resonance.

Further, Japanese Patent Application Publication No. 2010-148265 discloses another actuator which includes a driver element on a meander oscillator to improve power supply efficiency to the driver element, for example.

Further, Japanese Patent Application Publication No. 2004-304856 discloses an actuator which includes a movable element, meander beam elements swingably supporting the movable element relative to the frame element, and a pectinate element fixed at a position to engage with the meander beam elements while the movable element is moved, for example.

This type of actuator, a MEMS device made of silicon as a brittle material, is likely to break down when receiving vertical force relative to the rotary axis.

Moreover, by use of this type of actuator in an optical scanner for two-dimensionally scanning an object with an optical beam to generate an image, lower stiffness of a spring system is preferable for the purpose of decreasing resonance frequency in sub scan direction and driving the actuator by small power even when no resonance occurs due to too high resonance frequency of a supporting spring system relative to a desired oscillation frequency. However, due to a low spring stiffness, the mechanical strength of the actuator is decreased so that it is more likely to be damaged or break down.

Moreover, the meander beam elements disclosed in the above documents achieve low spring stiffness in a limited space but have a problem in that applied with an impact, it is likely to move greatly compared with straight beam elements, therefore, more likely to break down.

FIG. 6 shows the normal rotation of the movable element 33 around the rotary axis O, for example. It is rotated as it is designed so that the moving area of the movable element 33 is limited and the actuator 30 is unlikely to break down.

Meanwhile, in FIGS. 7 to 8 the beam elements 32 (meander beam elements 34) are deformed and distorted, given unexpected force to the movable element 33 to move off of the rotary axis O. There is a possibility that the moving element 33 may hit a circuit element or the like disposed near the actuator 30 and the actuator 30 may be broken down.

SUMMARY OF THE INVENTION

The present invention aims to provide an actuator which is prevented from being broken down or damaged when receiving an impact, as well as to a protective cover for such an actuator, an actuator manufacturing method, an optical deflector incorporating the actuator, and a two dimensional optical scanner and an image projector incorporating the optical deflector.

According to one aspect of the present invention, an actuator includes a frame element, a pair of beam elements, a movable element rotatably supported by the frame element via the beam elements, a driver configured to rotate the movable element relative to the frame element around the beam elements as a rotary shaft, and damper elements provided on a rotary axis of the beam elements.

BRIEF DESCRIPTION OF THE DRAWINGS

Features, embodiments, and advantages of the present invention will become apparent from the following detailed description with reference to the accompanying drawings.

DETAILED DESCRIPTION OF THE PREFERRED EMBODIMENTS

Hereinafter, embodiments of the present invention will be described in detail with reference to the accompanying drawings. Wherever possible, the same reference numbers will be used throughout the drawings to refer to the same or like parts.

First Embodiment

Figure 1:
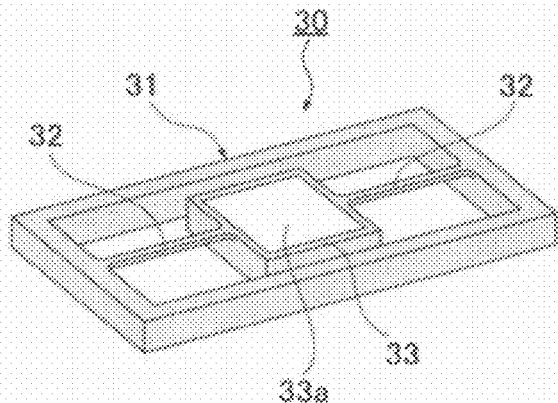
FIG. 1 is a schematic perspective view of the structure of a conventional actuator by way of example.
Figure 2:
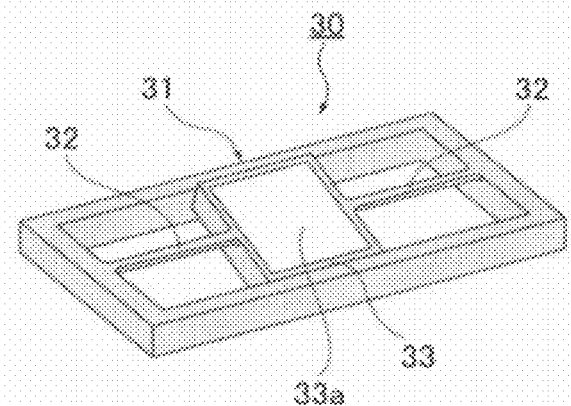
FIG. 2 is a perspective view of a movable element in FIG. 1 when rotated in one direction.
Figure 3:
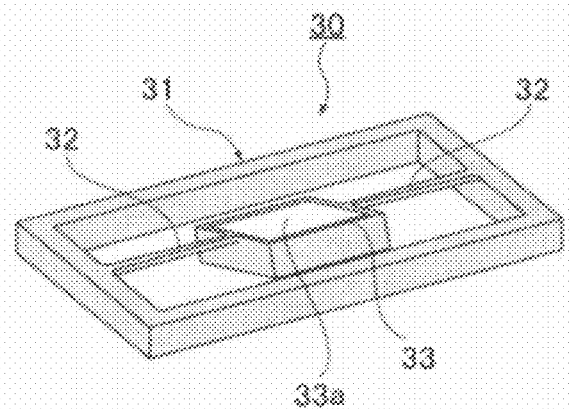
FIG. 3 is a perspective view of the movable element in FIG. 1 when rotated in the other direction.
Figure 4:
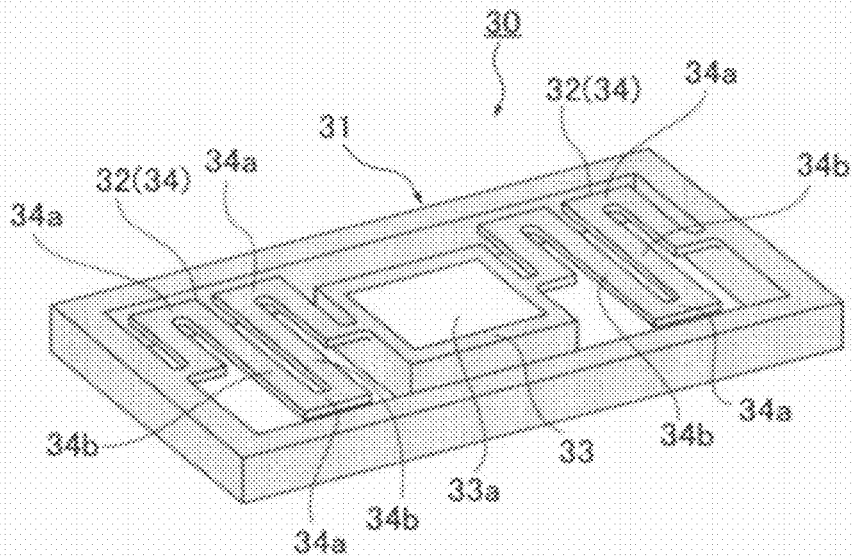
FIG. 4 is a perspective view of another conventional actuator which includes meander beam elements connecting the movable element and the frame element.
Figure 5:
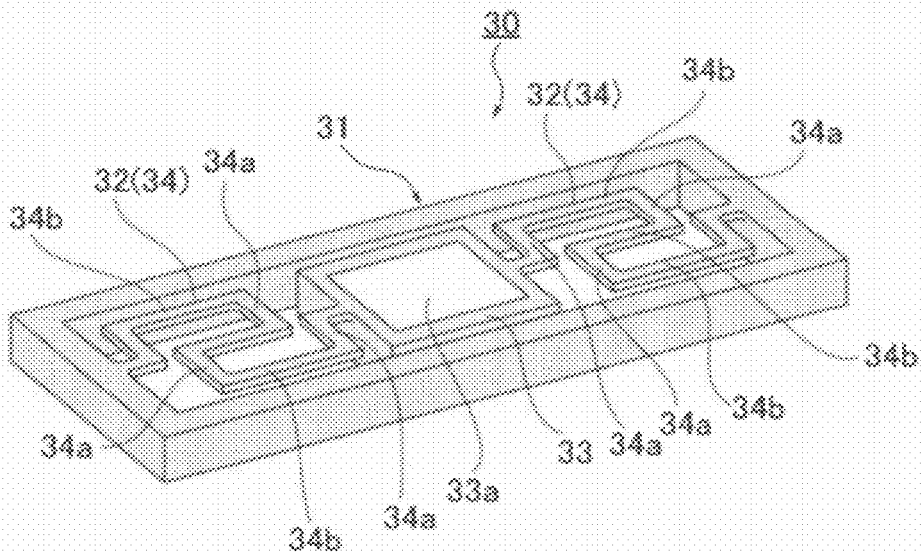
FIG. 5 shows another example of the meander beam elements in FIG. 4.
Figure 6:
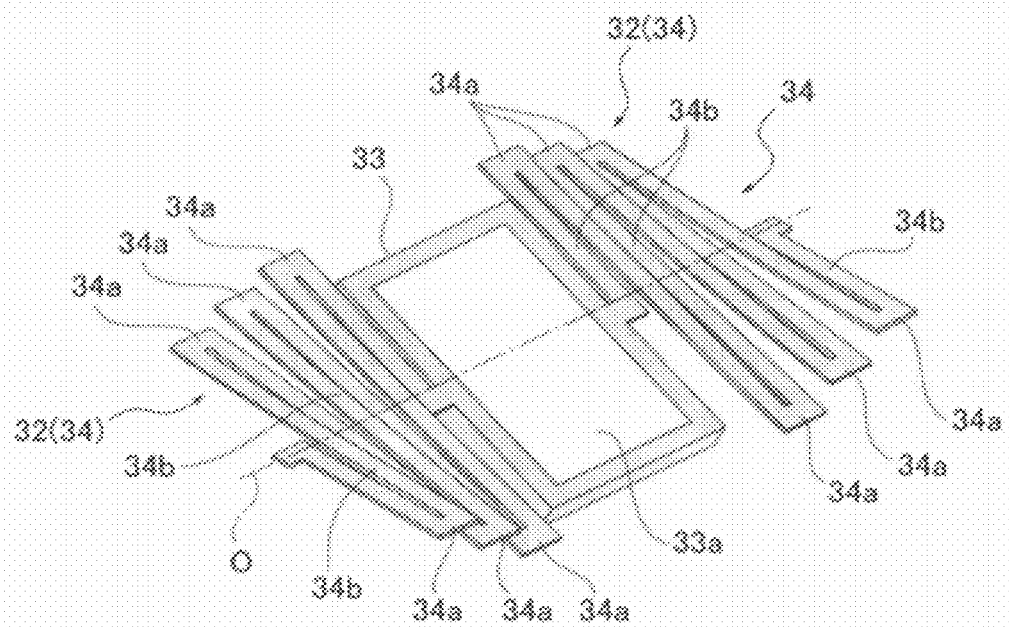
FIG. 6 shows the meander beam elements in normal state when the movable element is rotated around the rotary axis as it is designed.
Figure 7:
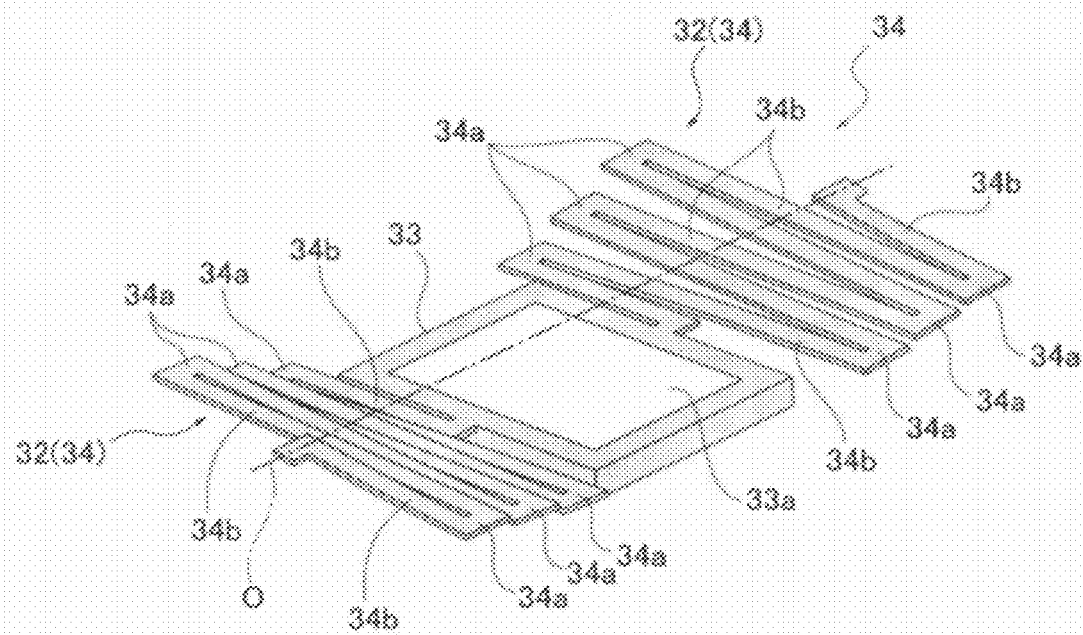
FIG. 7 shows deformed meander beam elements when the movable element is unintentionally rotated off of the axis.
Figure 8:
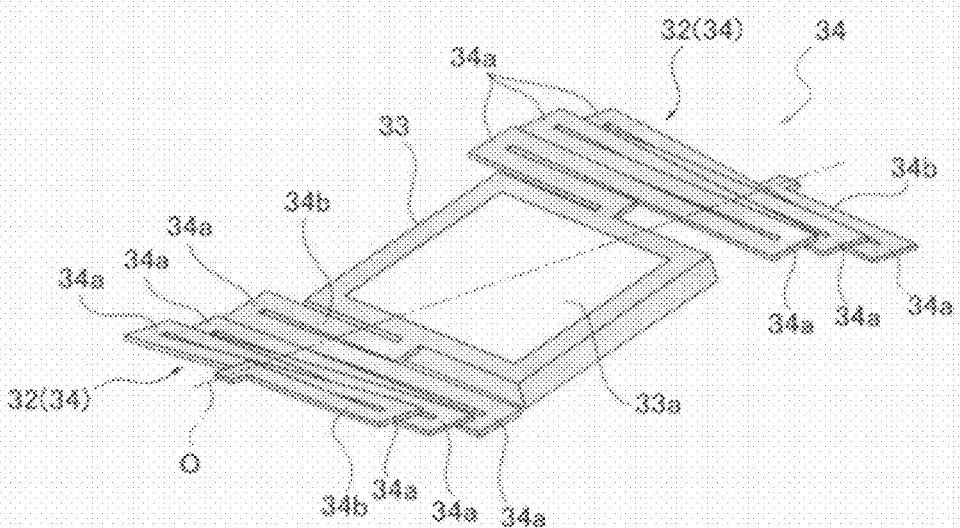
FIG. 8 shows another example of deformed meander beam elements when the movable element is unintentionally rotated off of the axis.
Figure 9:
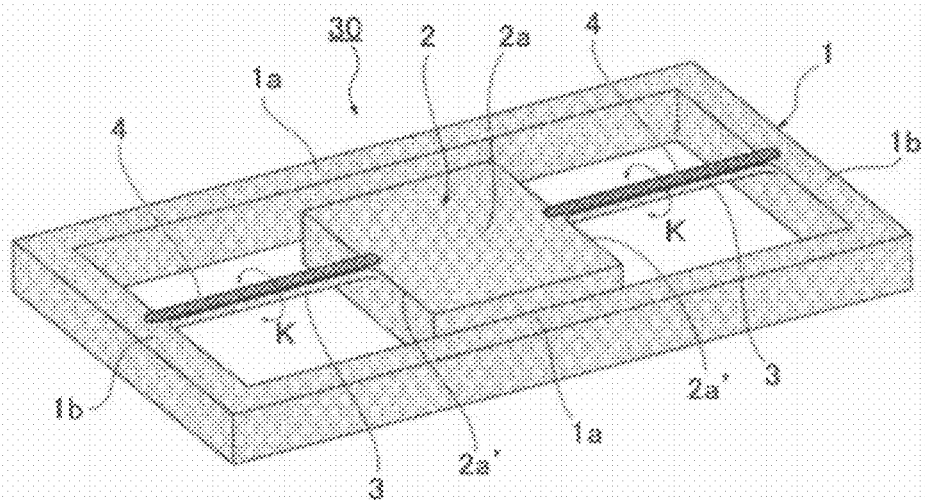
FIG. 9 is a perspective view of an actuator according to a first embodiment of the present invention, showing the front side of the movable element.

FIG. 9 shows an actuator as a MEMS device according to a first embodiment of the present invention by way of example. In FIG. 9 an actuator 30 includes a rectangular frame element 1, a square movable element 2 and a pair of beam elements 3. The frame element 1 is comprised of long frame portions 1a and short frame portions 1b and the movable element 2 is held in the short frame portions 1b via the beam elements 3.

Figure 10:
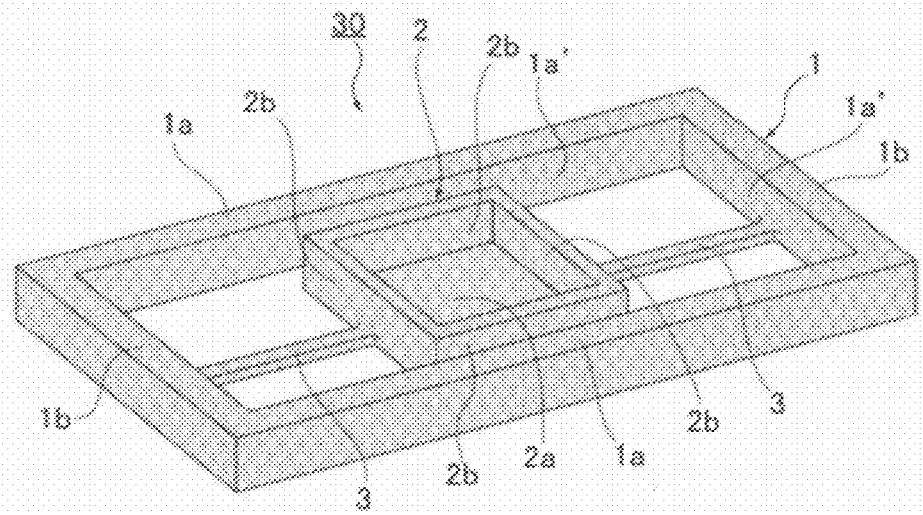
FIG. 10 is a perspective view of the actuator in FIG. 9, showing the back side of the movable element.

As shown in FIGS. 9, 10 the movable element 2 includes a plate portion 2a on the front side and reinforcing walls 2b on the back side. The pair of beam elements 3 extends in parallel with the long frame portions 1a and functions to rotatably support the movable element 2 around the longitudinal direction of the frame element 1.

The pair of beam element 3 is configured to be long and thin to reduce spring stiffness so that it can rotate with a predetermined amplitude and low frequency by small drive force. Damper elements 4 are formed on the rotary axis of the beam elements 3, extending across the short frame portions 1b to edges 2a' of the plate portion 2a.

The damper elements need to be made from a material with very small elasticity compared with silicon forming the beam elements 3, attenuation property, and force absorbability. They also need to be able to resist the deformation of the beam elements 3 and the rotary speed thereof.

Such material will be a gel material or rubber material with high viscosity enough to sustain the shape of the damper elements 4. Gel material made from silicon is well known and some gel material has property to increase in viscosity when irradiated with ultraviolet light or heated.

Another gel material made from two materials with small viscosity is well known to change to have high viscosity after elapse of a predetermined length of time. Using this material, it is able to efficiently, accurately form a high viscosity portion at a desired place by promptly mixing the two materials with low viscosity and coating the desired place with the mixed material. The damper elements 4 according to the present embodiment are made from an ultraviolet curable gel material.

The actuator 30 in FIG. 9 includes a not-shown drive element. The drive element can be of an electromagnetic or electrostatic type, or a piezoelectric element or the like.

The damper elements 4 have resistance in proportion to the speed at which the rotary shaft is deformed so that it can prevent the beam elements from being largely deformed due to impact or impulsive force. Thereby, it can prevent the actuator 30 from being damaged or broken down.

Meanwhile, according to the actuator 30, displacement of the damper elements 4 is small during normal rotation. In addition, presence of the damper elements does not increase resistance to rotary oscillation.

Therefore, the long and thin beam elements 3 as a rotary shaft with low spring stiffness does not increase resistance to rotary oscillation and can be prevented from largely deformed upon receiving an impact. This can prevent the actuator 30 from being damaged.

Second Embodiment

Figure 11:
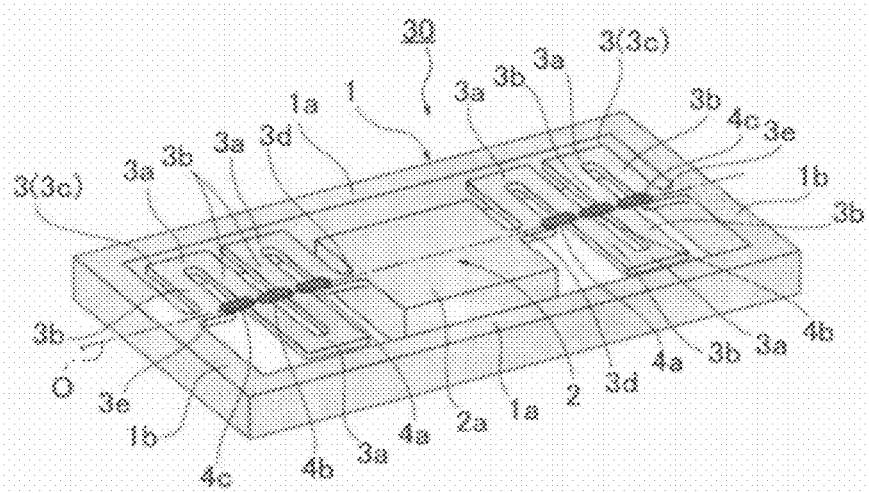
FIG. 11 is a perspective view of an actuator according to a second embodiment of the present invention which includes meander beam elements.

FIG. 11 shows another example of the beam elements 3 as meander beam elements 3c composed of turnback portions 3a and straight portions 3b. The turnback portions 3a extend in parallel to the long frame portions 1a while the straight portions 3b extend in parallel to the short frame portions 1b.

The meander beam elements 3c include connecting shafts 3d, 3e rotatably connecting the movable element 2 to the frame element 1. The straight portions 3b extend in a direction orthogonal to a rotary axis O connecting the connecting shafts 3d, 3e. The damper elements 4 according to the present embodiment are discontinuously disposed on the rotary axis O of the meander beam elements 3c.

The damper elements 4 according to the present embodiment are comprised of damper elements 4a connecting the connecting shafts 3d and the straight portions 3b, damper elements 4b connecting between the straight portions 3b and damper elements 4c connecting the straight portions 3b and the connecting shafts 3e. Thus, the damper elements extend across the discontinuous spaces of the meander beam elements 3c on the rotary axis O.

Figure 12:
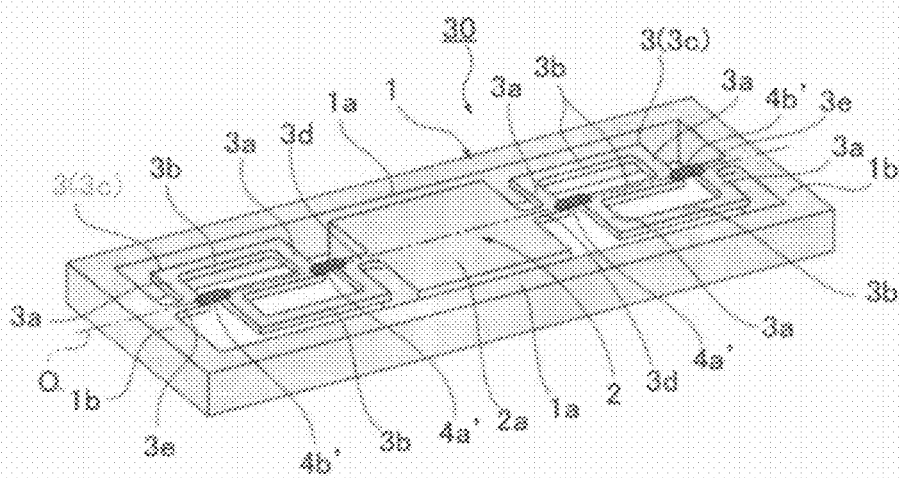
FIG. 12 is a perspective view of another example of the meander beam elements in FIG. 11.

FIG. 12 shows another example of the meander beam elements 3c including the turnback portions 3a parallel to the short frame portions 1b and the straight portions 3b parallel to the long frame portions 1a. The straight portions 3b are also parallel to the rotary axis O.

The damper elements 4 are comprised of damper elements 4a' connecting the connecting shafts 3d and the turnback portions 3a and damper elements 4b' connecting the turnback portions 3a and the connecting shafts 3e.

The actuator 30 shown in FIGS. 11 to 12 including the beam elements in meander form can reduce spring constant in torsional direction and the movable element 2 can be oscillated with low frequency by a small drive force.

With use of a material with small viscosity for the damper elements 4, the viscosity can be increased by ultraviolet irradiation to prevent the damper elements from sagging. With use of a heat curable gel material for the damper elements 4, the viscosity thereof can be increased by heating.

The damper elements 4 themselves exert slight elasticity to prevent the beam elements from bending by the weight of the movable element 2. According to the present embodiment, the beam elements 3 are meandered to reduce spring stiffness for the purpose of rotating with low frequency by small drive force and the damper elements 4 are arranged on the rotary axis on which amount of displacement of the beam elements 3 is small. Therefore, presence of the damper elements 4 does not increase resistance to rotary oscillation and they can prevent the beam elements 3 from largely deformed upon receiving an impact, as in the first embodiment. This can prevent the actuator 30 from being damaged.

The inventors of the present invention conducted an impact-resistance test of the actuators 30 in FIG. 11 with and without the damper elements 4 using a same impact testing machine. It was confirmed that the actuator 30 having the damper elements 4 exerts resistance to acceleration about twice as large as the actuator 30 not having the damper elements 4.

Further, in order to check whether or not the damper elements adversely effect rotary oscillation, the angular amplitude of the movable element 2 having a piezoelectric film (in FIG. 19, for example) relative to drive frequency is measured while the piezoelectric film is applied with a voltage at constant amplitude and the drive frequency of applied voltage is changed from small to large.

Figure 13:
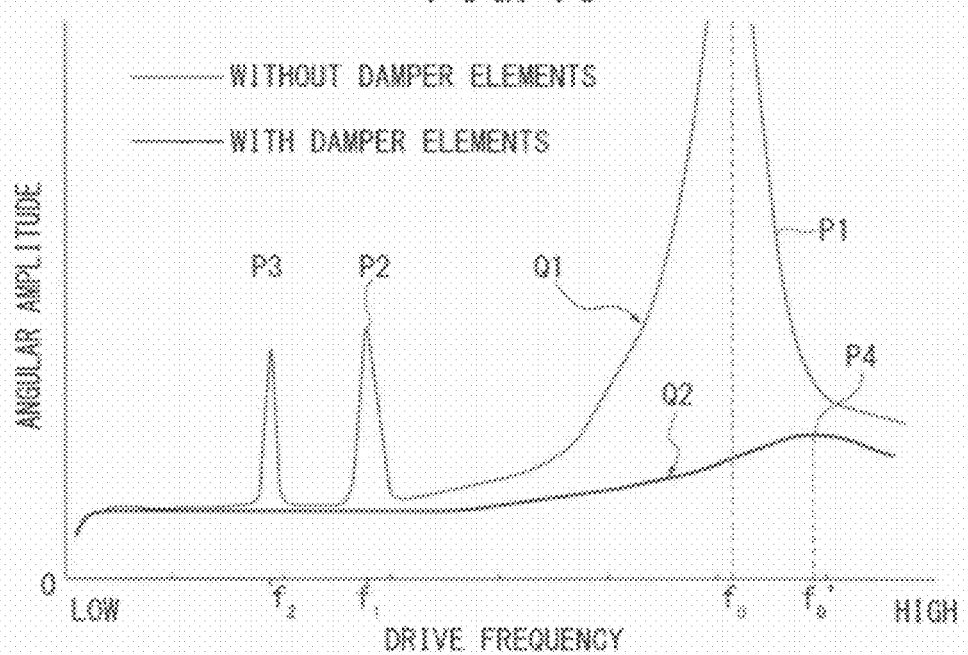
FIG. 13 is a graph showing a relation between the drive frequency of an applied voltage and angular amplitude.

FIG. 13 is a graph of the angular amplitude relative to the drive frequency of applied voltage. In FIG. 13 angular amplitude characteristic curve Q1 is of the actuator 30 not having damper elements 4 and angular amplitude characteristic curve Q2 is of the actuator 30 having the damper elements 4.

Without the damper elements 4, a sharp resonance P1 occurs at a high drive frequency f0 and resonances P2, P3 occur at drive frequencies f1, f2, about half, one-third of the frequency f0, respectively, as shown in the angular amplitude characteristic curve Q1.

To the contrary, with the damper elements 4, resonance P4 occurs at a drive frequency f0' higher than the frequency f0 and the peak of the amplitude of the resonance P4 is much lower than that of the resonance P1.

Further, the amplitude sensitivity (angular amplitude per unit voltage) of the actuator 30 having the damper elements 4 does not decrease in a low drive frequency range unlike that of the actuator 30 not having the damper elements 4.

Further, the resonances P2, P3 at the frequencies f1, f2 do not occur in the angular amplitude characteristic curve Q2 of the actuator 30 having the damper elements 4.

Thus, the actuator 30 having the damper elements 4 does not decrease in amplitude sensitivity in an intended low frequency drive range and does not suffer resonances P2, P3 at the frequencies f1, f2 either. Accordingly, if an electronic device incorporating this actuator 30 is oscillated at the frequencies f1, f2, the angular amplitude thereof will not be beyond the values of designed angular amplitude.

Figure 14:
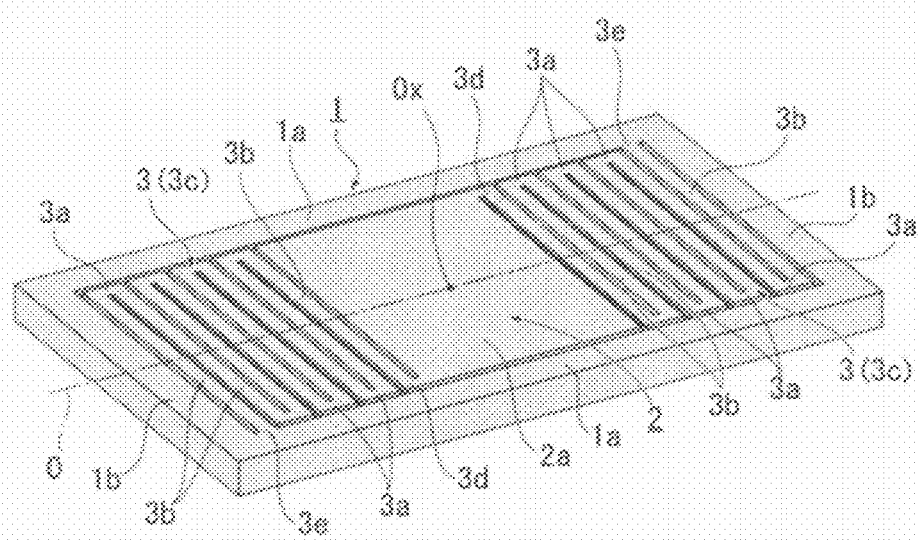
FIG. 14 is a perspective view of an example of an actuator according to a second embodiment of the present invention which includes, at positions away from the rotary axis, a first connecting shaft connecting the meander beam elements to the movable element and a second connecting shaft connecting the meander beam elements to the frame element.

Next, FIG. 14 shows another example of the frame element 1 including the connecting shafts 3d, 3e of the meander beam elements 3c placed away from the rotary axis O instead of the ones in FIG. 11, FIG. 12 extending along the rotary axis O.

In FIG. 14 the pair of connecting shafts 3d is symmetrically disposed at opposite corners from a diagonal center Ox of the square movable element 2. The pair of connecting shafts 3e is symmetrically disposed at opposite corners from the diagonal center Ox (coinciding with that of the movable element 2) of the rectangular frame element 1.

Figure 15:
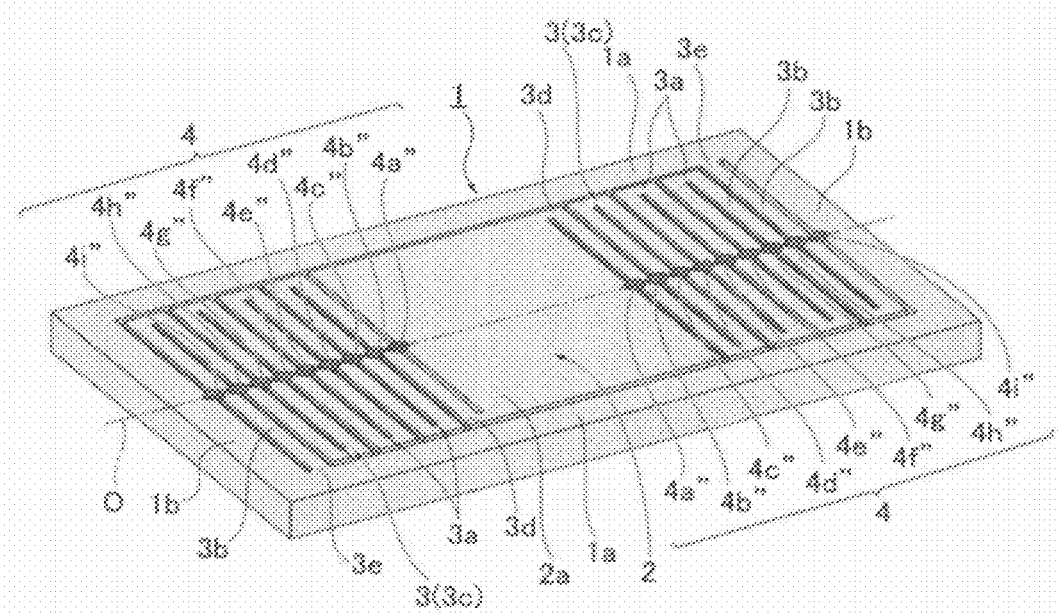
FIG. 15 shows damper elements discontinuously disposed on the rotary axis of the actuator in FIG. 14 to traverse straight portions.

Damper elements 4a" to 4i" formed on the rotary axis O are shown in FIG. 15. They are discontinuously disposed on the rotary axis O, extending across the straight portions 3b. The actuator 30 including the above-configured frame element 1 can achieve the same effects as those of the actuator 30 in FIG. 11.

The pairs of connecting shafts 3d, 3e can be arbitrarily disposed in replace of the arrangement in FIGS. 14-15.

Third Embodiment

Figure 16:
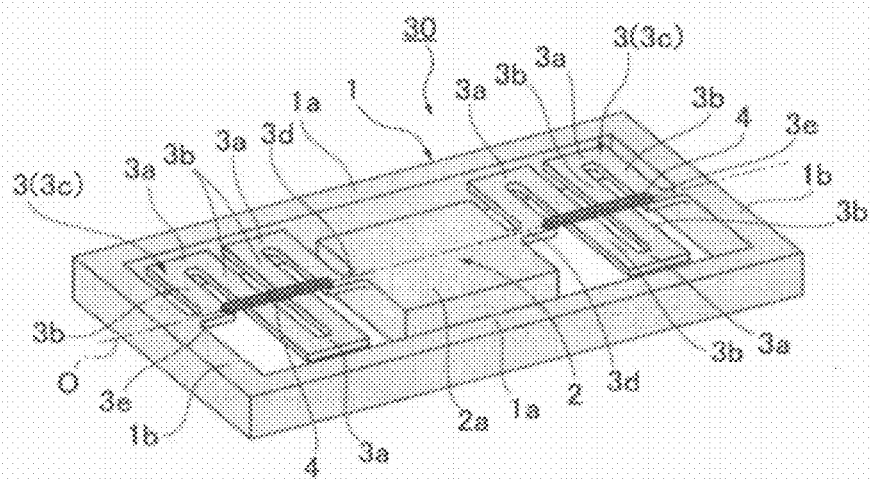
FIG. 16 is a perspective view of an actuator according to a third embodiment of the present invention which includes damper elements continuously formed on the meander beam elements in FIG. 11.
Figure 17:
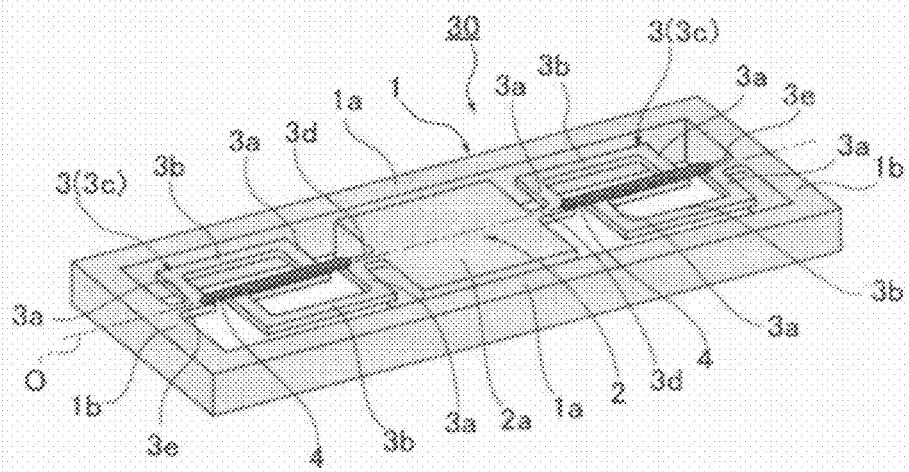
FIG. 17 is a perspective view of the actuator which includes damper elements continuously formed on the meander beam elements in FIG. 12.

FIG. 16 shows another example of the actuator 30 in FIG. 11 including the damper elements 4 configured to continuously extend across the straight portions 3b on the rotary axis O. FIG. 17 shows another example of the actuator 30 in FIG. 12 including the damper elements 4 configured to continuously extend in parallel to the straight portions 3b on the rotary axis O.

By continuously forming the damper elements 4 on the meander beam elements 3c as shown in FIGS. 16-17, the contact area of the beam elements 3c and the damper elements 4 can be enlarged and the damper elements can be prevented from detaching from the beam elements 3 and securely fixed thereon. Also, the damper elements 4 can be easily applied onto the beam elements 3.

Figure 18:
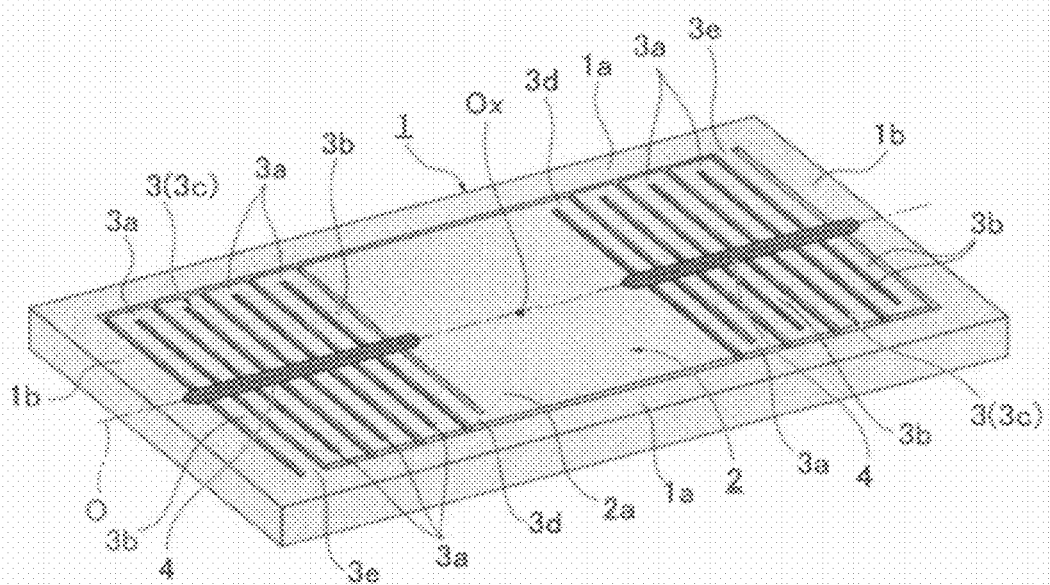
FIG. 18 shows damper elements continuously disposed on the rotary axis of the actuator in FIG. 14 to traverse straight portions.

Further, FIG. 18 shows another example of the actuator 30 in which the damper elements 4 are continuously formed to extend across the straight portions 3b on the frame element 1 in which the pairs of connecting shafts 3d, 3e are symmetrically disposed at opposite corners from the diagonal center Ox in FIG. 14. The actuator 30 in such a structure can achieve the same effects as those of the ones shown in FIGS. 11-12 and FIG. 14.

Fourth Embodiment

Figure 19:
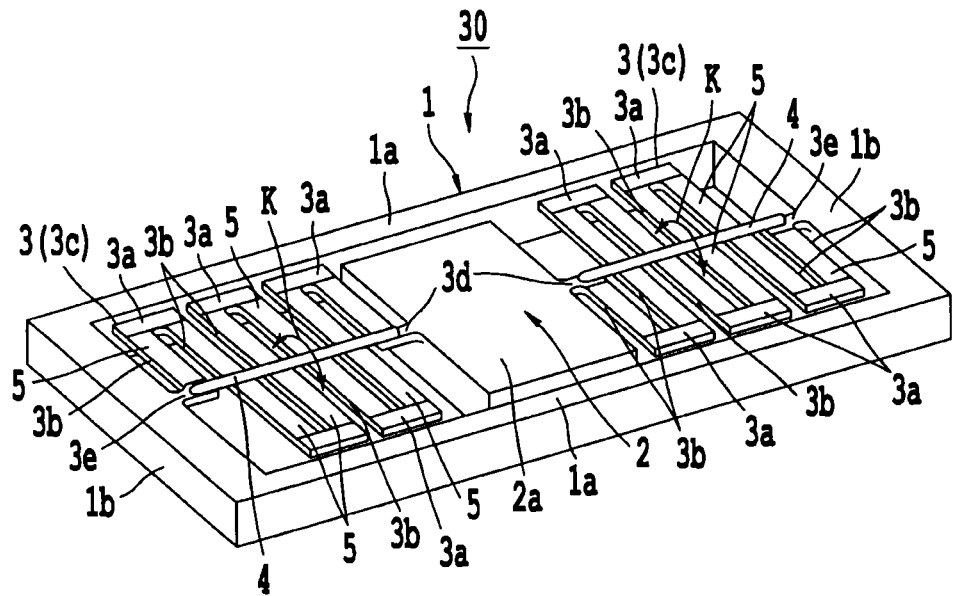
FIG. 19 is a perspective view of an actuator according to a fourth embodiment in which piezoelectric films are formed on the straight portions of the beam elements.

FIG. 19 shows another example of the actuator 30 in which piezoelectric films 5 are formed on the straight portions 3b of the meander beam elements 3c. Applied with a voltage to the piezoelectric films, the movable element 2 is rotated, as indicated by the arrow K in FIG. 19. By changing the warping direction of the piezoelectric films 5, each of the straight portions 3b is slightly moved. Each movement is added up to greatly change the amplitude of the movable element 2.

Figure 20:
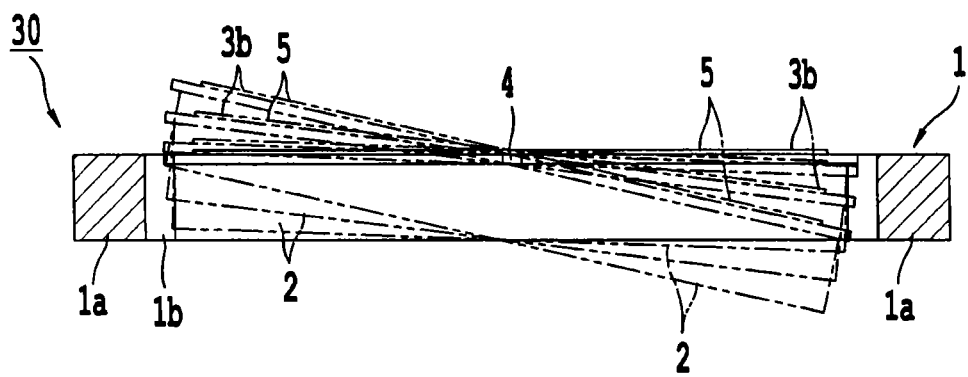
FIG. 20 shows the actuator in FIG. 19 when the beam elements are moved, applied with a voltage.

The damper elements 4 are disposed between the connecting shafts 3d, 3e to extend across the straight portions 3b on the rotary axis. FIG. 20 shows virtual inclination of the straight portions 3b seen from the rotary axis when the movable element is inclined. It is seen from the drawing that the movable element 2 is greatly inclined relative to the frame element 1 by the sum of moving amounts of the respective straight portions 3b.

The damper elements are given torsional stress but not large pulling force or compression stress. Therefore, without causing large resistance during normal operation and increasing resistance to normal rotary oscillation, they can prevent the beam elements from being largely deformed upon receiving an impact and prevent the actuator 30 from being damaged. Further, since the piezoelectric films are directly formed on the beam elements 3, the actuator 30 does not have to be increased in size.

Fifth Embodiment

Figure 21:
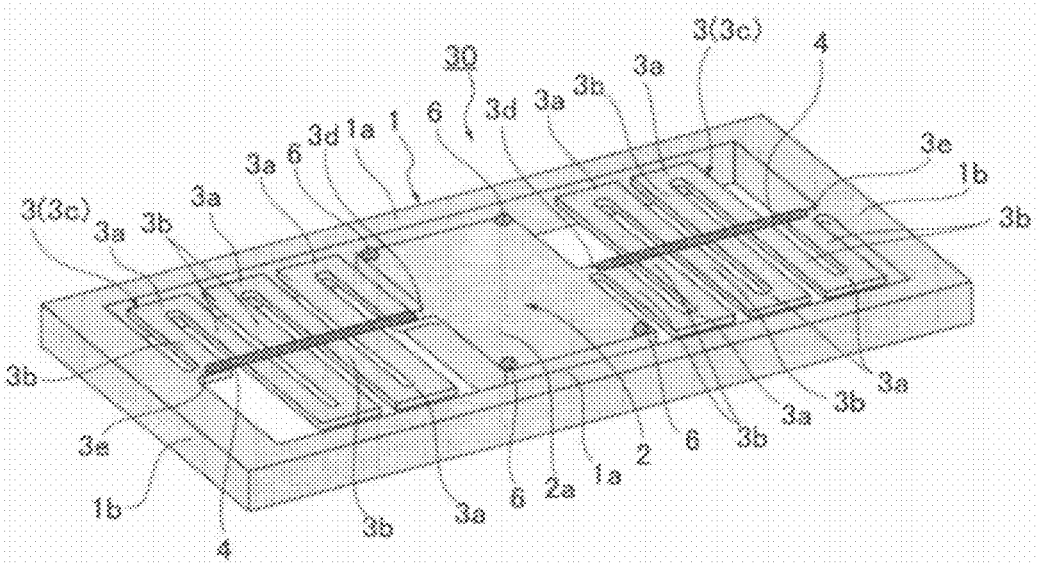
FIG. 21 is a perspective view of an actuator according to a fifth embodiment which includes impact reducing elements at the four corners of a plate portion of the actuator in FIG. 19.

FIG. 21 shows an example of the actuator 30 including impact reducing elements 6 on the plate portion 2a of the movable element 2 in FIG. 19. The impact reducing elements 6 are configured to abate impact from the movable element 2's being greatly moved and hitting another element. They are made from the same gel material as that of the damper elements 4.

The movable element 2 and beam elements 3 made from a brittle material such as silicone may be damaged by impact. With provision of the flexible impact reducing elements 6 on the plate portion 2a away from the connecting shafts 3d, 3e, they can reduce impact from the movable element 2 hitting another element for any cause.

By using the same material, the impact reducing elements 6 and the damper elements 4 can be simultaneously formed in the actuator 30 through a single manufacturing process of ultraviolet irradiation, heating and else, which contributes to shortening the working time for producing the actuator 30.

Sixth Embodiment

Figure 22:
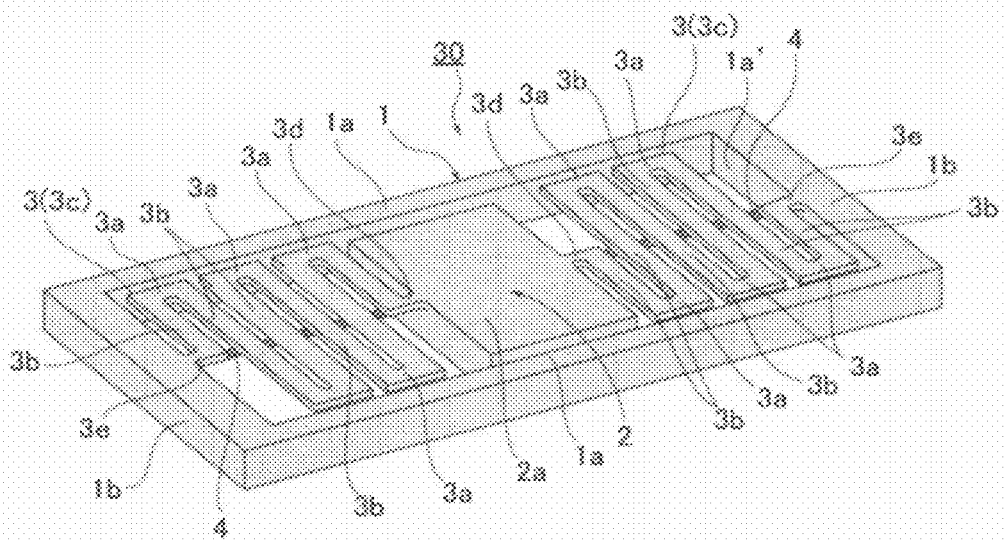
FIG. 22 is a perspective view of the front side of an actuator according to a sixth embodiment.
Figure 23:
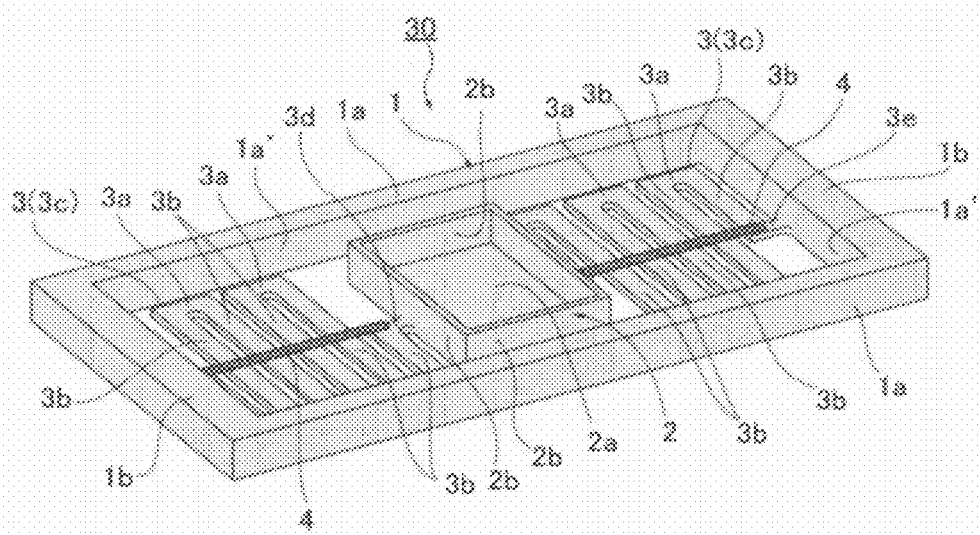
FIG. 23 shows the back side of the actuator in FIG. 22.

FIGS. 22-23 show examples of the actuator 30 in which the damper elements 4 are provided on the back faces of the beam elements 3. In FIGS. 19 and 21 the damper elements 4 are outwardly protruded from the surface of the frame element 1, which results in reducing the degree of freedom in which a not-shown element incorporating the actuator 30 is designed.

According to the present embodiment, the damper elements 4 are formed on the back side on which the reinforcing walls 2b of the movable element 2 and the walls 1a of the frame element 1 are provided. This can improve the degree of freedom in which the element incorporating the actuator 30 is designed.

Seventh Embodiment

Figure 24:
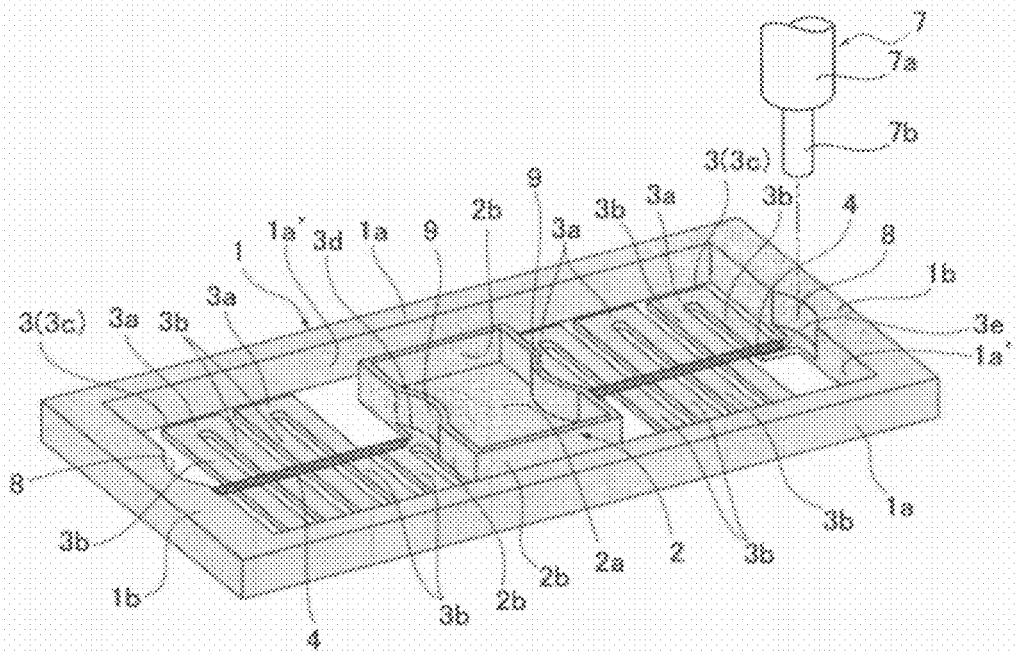
FIG. 24 is a perspective view of an actuator according to a seventh embodiment which includes, on the back side, concaves used for accommodating a discharge needle of a dispenser unit.

Now, a dispenser for forming the damper elements 4 on the back faces of the beam elements in FIG. 23 is described with reference to FIG. 24. The dispenser 7 includes a cylinder 7a and a discharge needle 7b. The cylinder 7a contains a gel material.

The dispenser 7 is configured to discharge gel material from the cylinder 7a. It controls the amount of gel material contained in the cylinder 7a, cylinder pressure, and length of discharge time, to discharge a constant amount of gel material from the discharge needle 7b.

With the dispenser 7 in use, the walls 1a' of the frame element 1 and reinforcing walls 2b of the movable element 2 interfere with the discharge needle 7b, which hinders the dispenser 7 from applying the gel material onto intended places of the connecting shafts 3d on the reinforcing walls 2b and the connecting shafts 3e on the walls 1a'.

In view of solving the above, according to the actuator 30 in the present embodiment, concaves 8, 9 are formed in the walls 1a' of the frame element 1 and the reinforcing walls 2b of the movable element 2, respectively, to guide the discharge needle 7b. Thus, with the concaves 8, 9 formed, the damper elements 4 can be formed precisely at intended positions of the connecting shafts 3d, 3e.

Eighth Embodiment

Next, examples of the manufacturing method for the damper element are described.

The damper element 4 made from a gel material by ultraviolet irradiation and heating is low in viscosity in the initial stage of curing process. Because of this, when applied onto the beam element 3, the gel material may run off the rotary axis and flow down, causing a hindrance to the normal rotation of the actuator 30.

Figure 25:
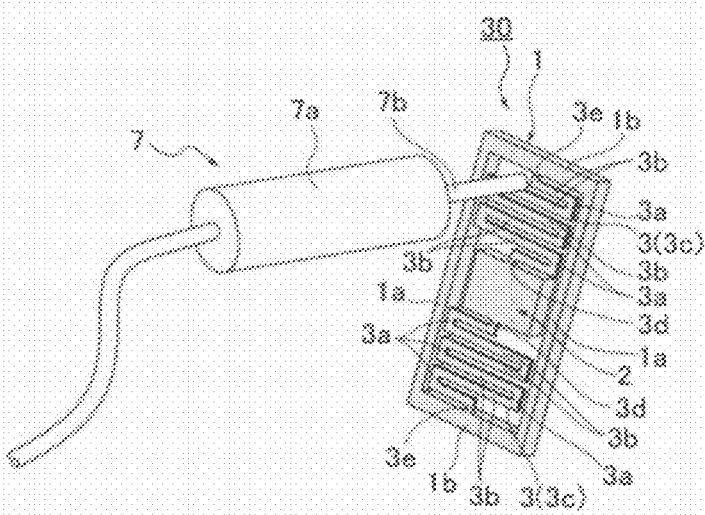
FIG. 25 shows an example of how the damper elements are formed on the beam elements in an actuator manufacturing method according to one embodiment of the present invention.

According to the present embodiment, for applying the damper element 4 onto the beam element 3, the actuator 30 is inclined so that the damper element 4 flows along the rotary axis, as shown in FIG. 25.

Then, the damper element 4 is cured to be fixed at an intended position of the beam element 3 by ultraviolet irradiation and heating. Thus, the damper element 4 can be formed in long and thin shape on the rotary axis by tilting the frame element 1 while the gel material is applied onto the beam element 3.

Ninth Embodiment

Figure 26:
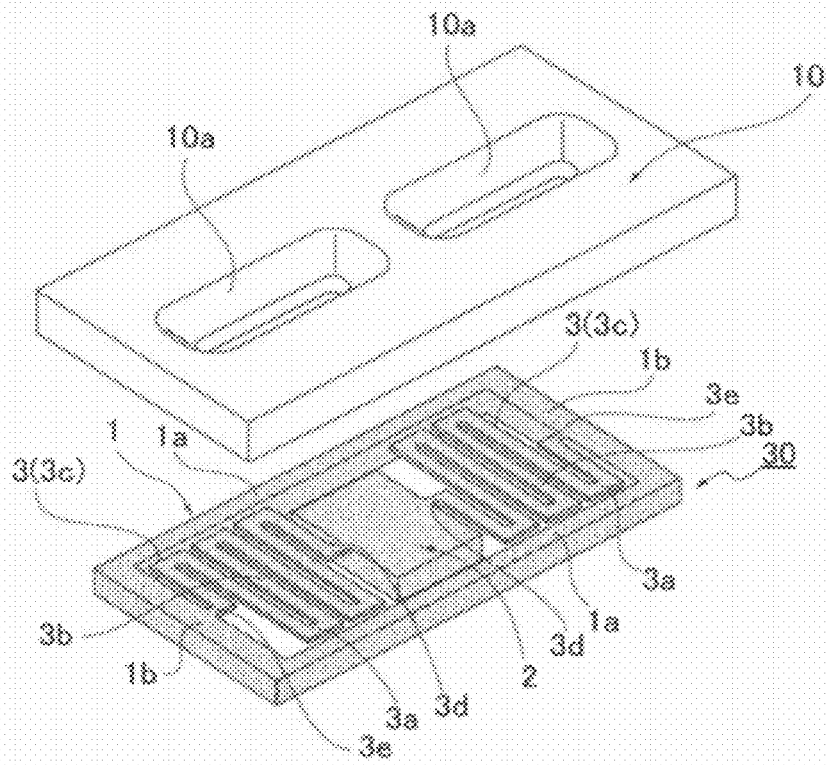
FIG. 26 shows a mold and the actuator disintegrated from each other.

FIG. 26 shows a mold 10 for forming the damper element 4 on the beam element 3 from a gel material with very small viscosity. The mold 10 for forming the damper element from an ultraviolet curable gel material is made from an ultraviolet or light permeable material.

Figure 27:
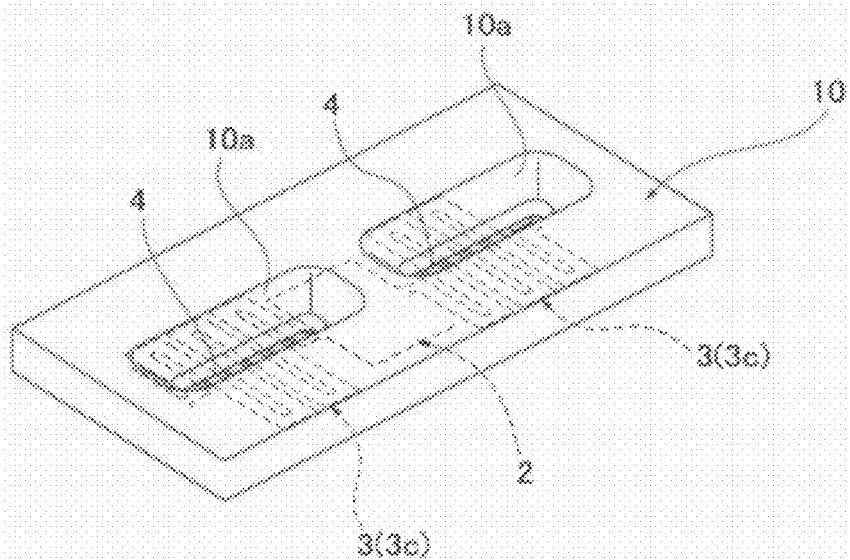
FIG. 27 shows the mold in FIG. 26 set with the frame element.

The mold 10 includes openings 10a, 10b to extend along the rotary axis and guide the discharge needle 7b. As shown in FIG. 27, the dispenser 7 is operated to apply the gel material onto the beam element 3 while the mold 10 is fitted into the frame element 1.

Then, the gel material of the damper element 4 is cured by ultraviolet irradiation. With use of a heat curable gel material for the damper element 4, the mold 10 is formed from a thermally conductive material and directly heated to cure the gel material to form the damper element 4.

Tenth Embodiment

Figure 28:
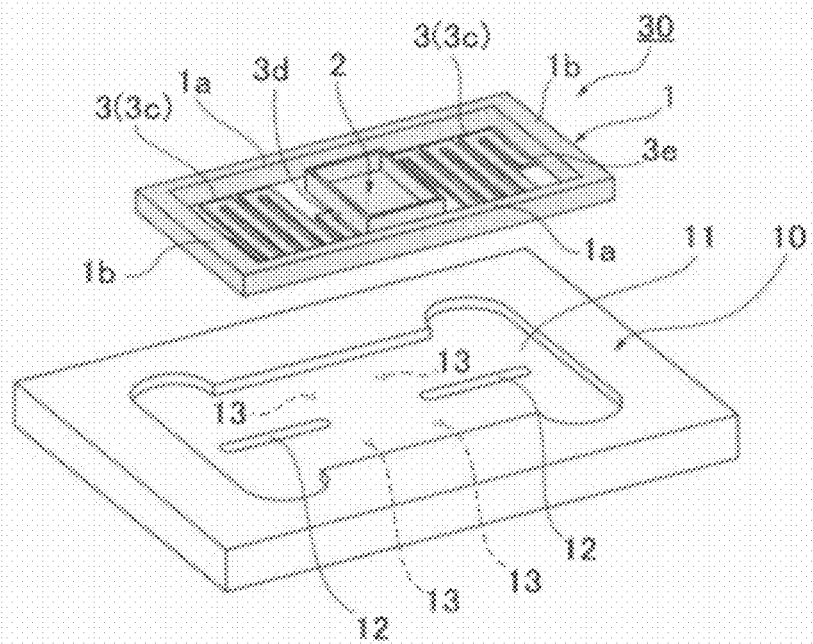
FIG. 28 shows another example of a mold and the actuator disintegrated from each other.

FIG. 28 shows another example of the mold 10 including a concave 11 to hold the actuator 30 for forming the damper element 4 from a gel material with very small viscosity. The concave 11 is formed in a shape to correspond with the meander beam elements and includes two depressions in which the gel material of the damper element 4 is retained.

Figure 29:
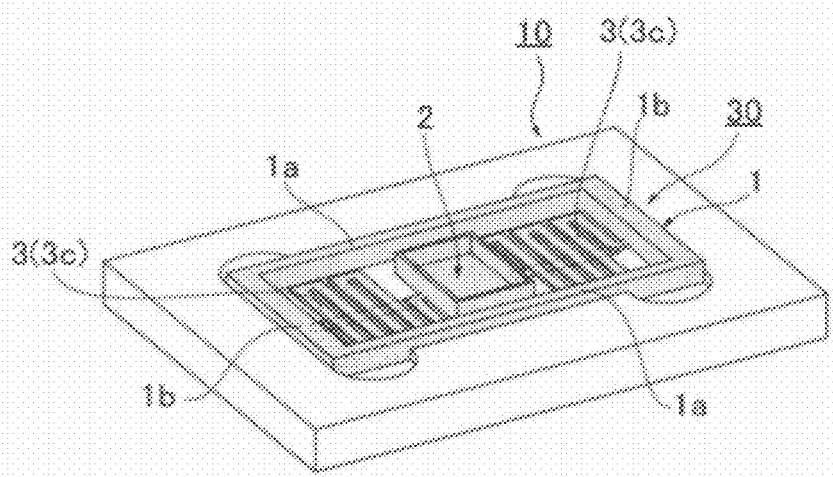
FIG. 29 shows the mold in FIG. 28 set with the frame element.

The gel material is poured into the depressions 12 and the actuator 30 is set on the mold 10 so that the front face of the actuator 30 faces the concave 11, as shown in FIG. 29. The mold 10 is made from an ultraviolet permeable gel material and the gel material in the depressions is cured by ultraviolet irradiation from below to form the damper element 4 on the surface of the meander beam element 3c.

Moreover, with provision of the impact reducing elements 6 on the plate portion 2a at positions away from the connecting shafts 3d, 3e, depressions 13 for forming the impact reducing elements 6 can be formed in the concave 11 of the plate portion 2a, as shown in FIG. 28.

Eleventh Embodiment

Figure 30:
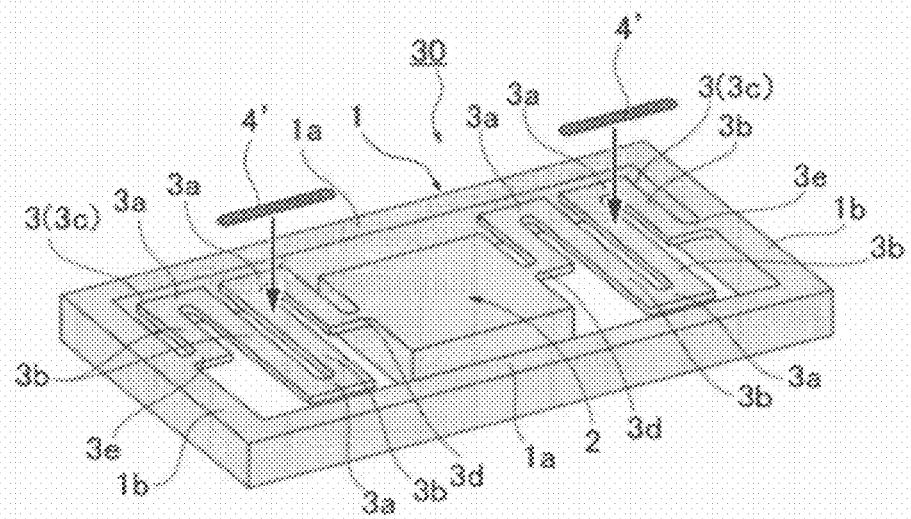
FIG. 30 shows how damper materials are attached to the beam elements.

FIG. 30 shows another example of manufacturing the actuator 30 in which an ultraviolet curable gel material is cured in desired shape and size in advance to form a damper element. Damper elements 4' can be adhered to the connecting shafts 3d, 3e with an adhesive which can be the gel material of the damper elements 4'.

With use of a heat curable gel material, the damper elements 4' can be attached to the meander beam elements 3c by heat curing. This can facilitate the work for producing the damper elements.

Twelfth Embodiment

Figure 31:
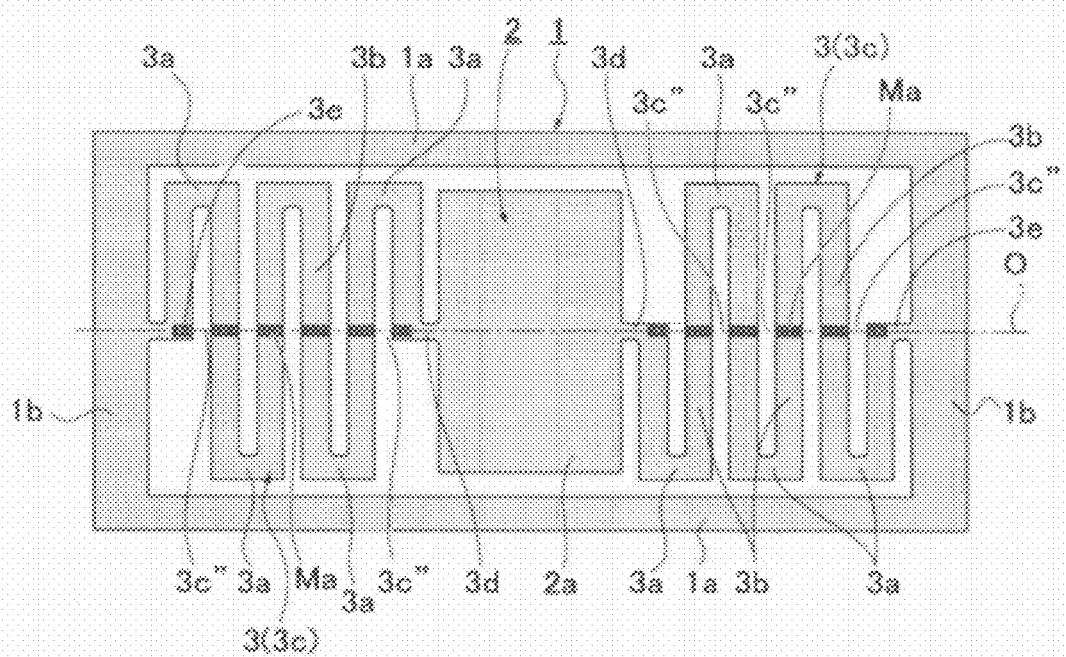
FIG. 31 shows position marks formed on the rotary axis of the meander beam elements for pattern recognition of the rotary axis.

FIG. 31 is a view to describe how to form position marks on the rotary axis O of the meander beam elements 3c for pattern recognition of the rotary axis O. In the present embodiment position marks Ma are formed by applying paint or the like on the rotary axis O of the meander beam elements 3c to traverse the straight portions 3b of the beam elements 3, for example.

The damper elements 4 are disposed in a direction of the position marks Ma arranged to cover the position marks Ma.

Thus, with provision of the position marks Ma on the rotary axis O for pattern recognition of the rotary axis O, it is possible to recognize the position of the rotary axis O while observing a partially enlarged area of the meander beam element 3c with a microscope to form the damper element 4. It is possible to know the position of the rotary axis O without changing the magnification of the microscope in the middle of the application process, which makes it possible to accurately, quickly apply the damper elements 4 on the meander beam element 3c.

Further, it is possible to easily check whether or not the damper elements 4 are properly disposed at the right positions on the rotary axis O or they extend across the space of the meander beam elements 3c properly. Moreover, automatic application of the damper elements 4 on the meander beam elements 3c can be easily realized by recognizing the position marks Ma with an image recognition means.

Thirteenth Embodiment

Figure 32:
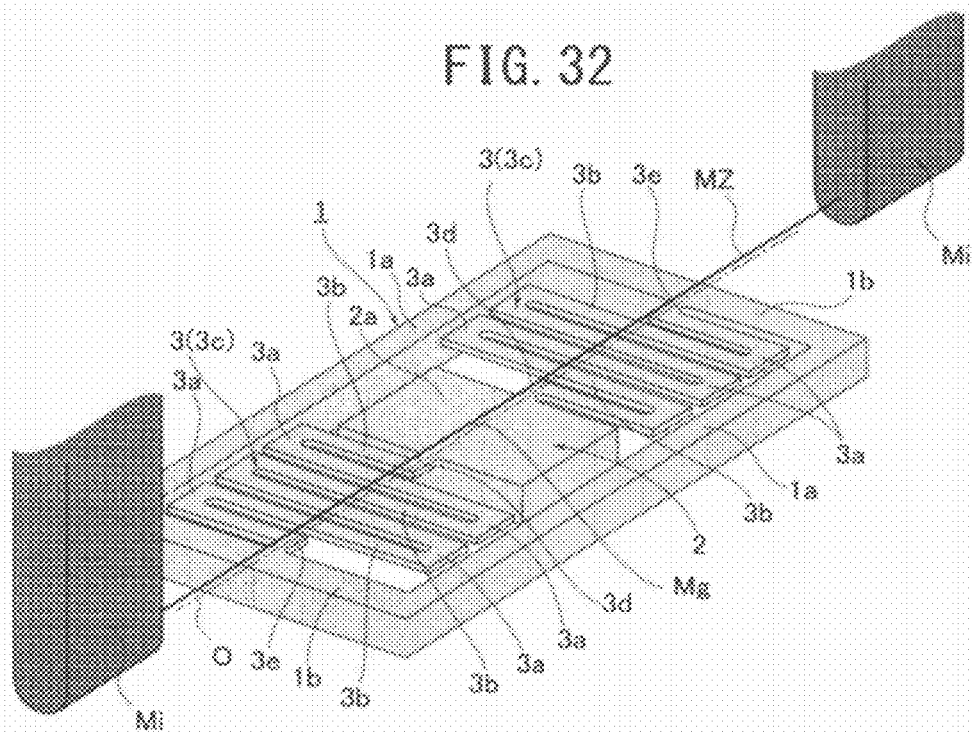
FIG. 32 shows a bar element disposed with a gap on the rotary axis of the meander beam elements.
Figure 33:
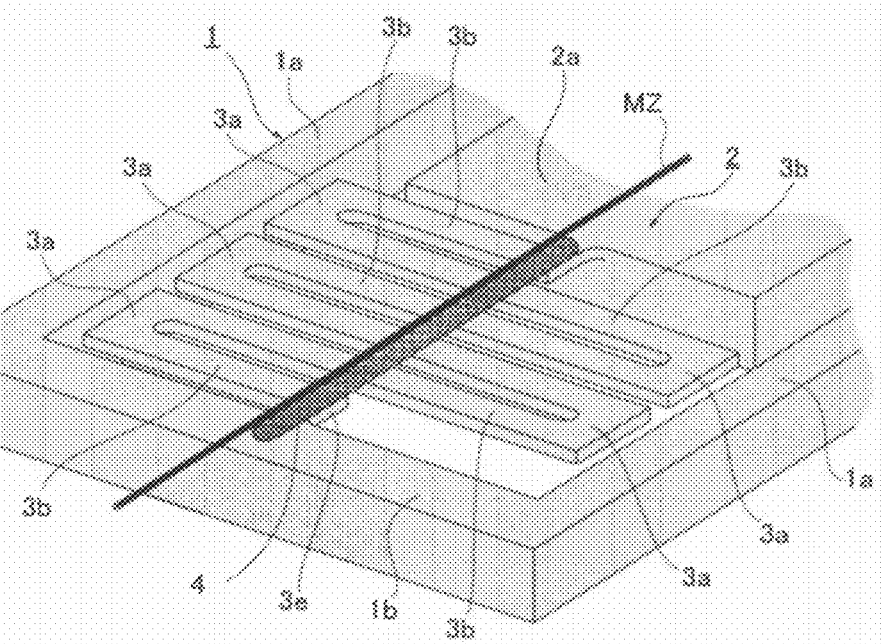
FIG. 33 is an enlarged view of a part of the bar element and the meander beam element between which the damper element is provided.

FIGS. 32-33 show examples of a bar element Mz provided to prevent the damper elements 4 from spreading and dropping. The bar element Mz is extended with tension along the rotary axis O with a gap over the rotary axis O of the meander beam elements 3c. Holding elements Mi are provided to hold both ends of the bar element Mz.

When poured into between the meander beam elements 3c and the bar element Mz, the gel material of the damper element is pulled over to the bar element Mz by surface tension and runs along the bar element Mz.

This can prevent the gel material from dropping down from the space between the straight portions 3b of the meander beam elements 3c in the middle of curing process by ultraviolet irradiation, for example.

Further, the gel material can be aggregated on the bar element Mz and on the rotary axis O of the meander beam elements 3c by surface tension. In other words, the gel material can be prevented from spreading from the rotary axis O to the surrounding.

After the gel material is cured to form the damper elements 4, the bar element Mz is removed from the damper elements 4.

Fourteenth Embodiment

Figure 34:
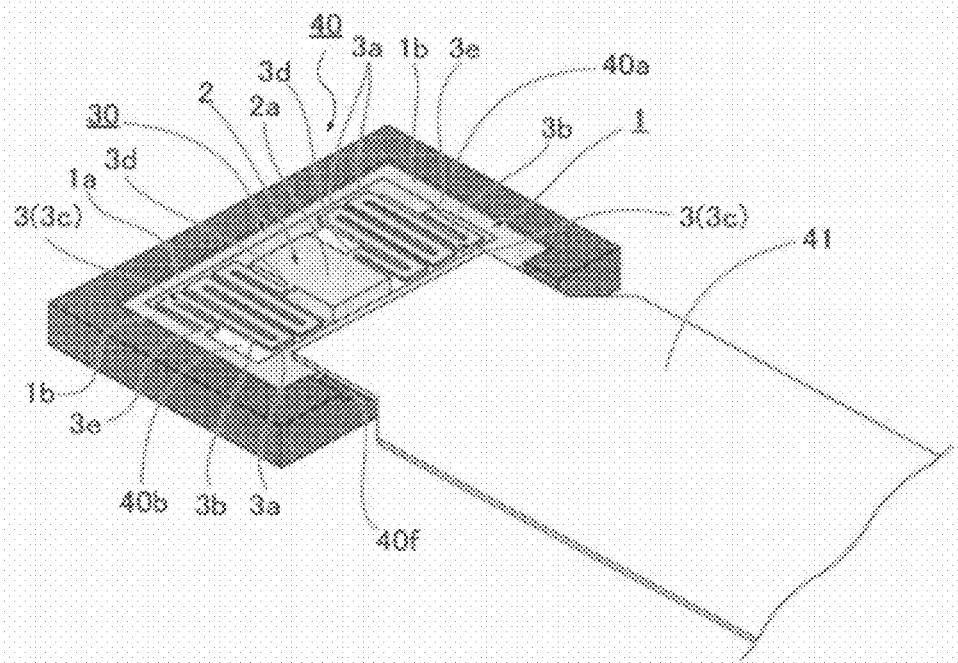
FIG. 34 shows a protective cover for actuator fitted with the actuator in FIG. 19.
Figure 35:
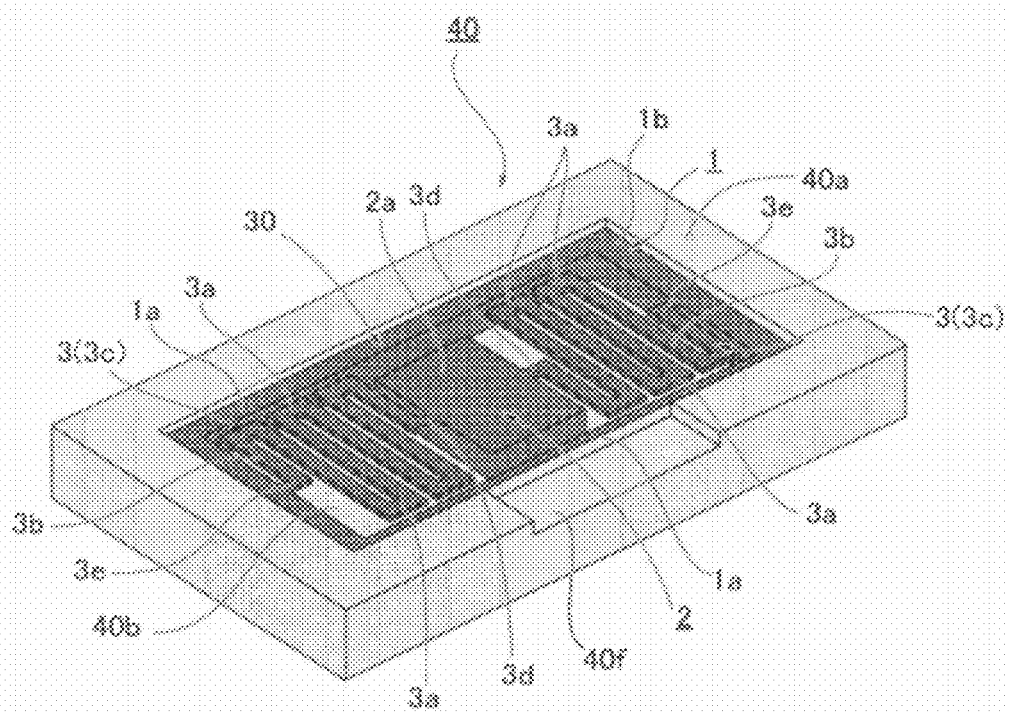
FIG. 35 is an enlarged perspective view of the protective cover in FIG. 34.
Figure 36:
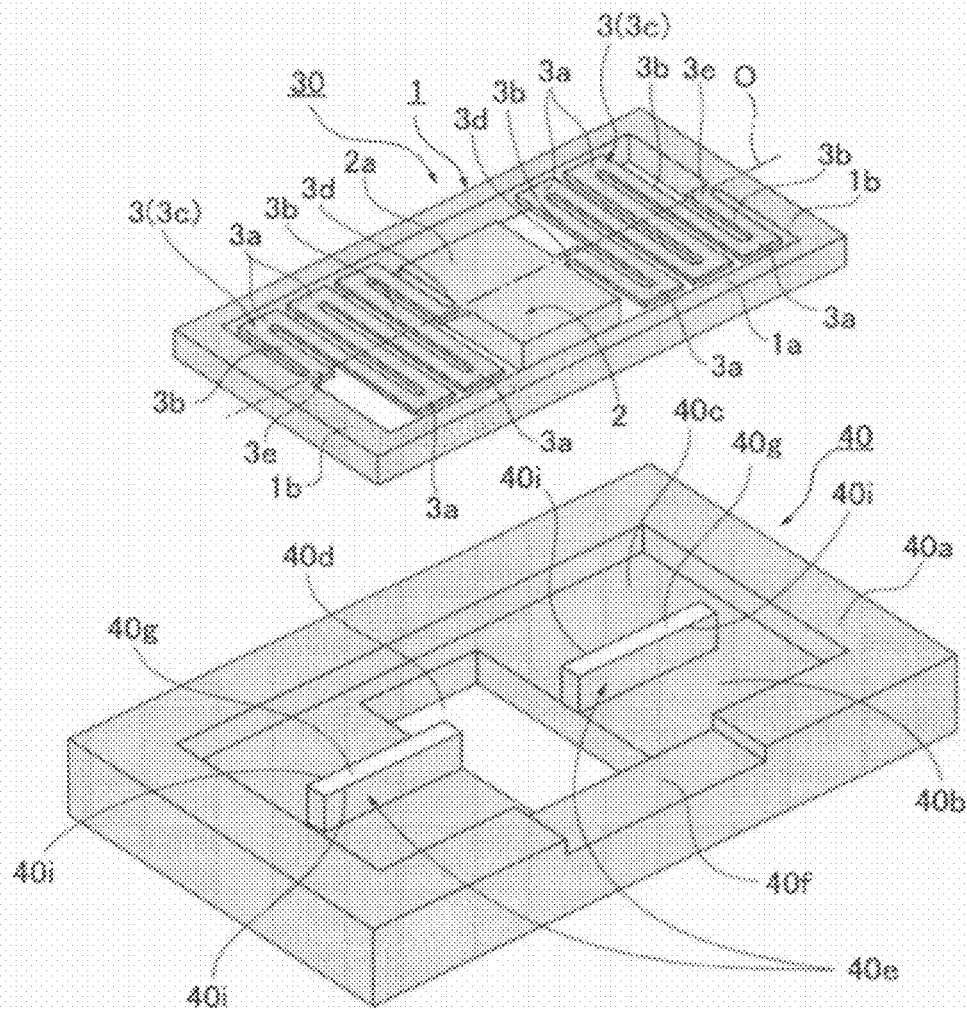
FIG. 36 is an exploded perspective view of the actuator and the protective cover in FIG. 35.

FIGS. 34 to 36 show examples of a protective cover for the actuator 30 according to any of the above embodiments. FIGS. 34-35 are perspective views of a protective cover 40 fitted into the actuator 30.

The protective cover 40 is comprised of a rectangular surrounding wall 40a and a bottom wall 40b. The space surrounded by the surrounding wall 40a is a space 40c in which the actuator 30 is set, as shown in FIG. 36. A space 40d is formed on the bottom wall 40b at a position opposite to the movable element 2 as shown in FIG. 36, to allow the movable element 2 to be rotated.

A pair of supporting walls 40e is formed to extend in opposite directions on the bottom wall 40b and sandwich the space 40d in-between them. The long side of the surrounding wall 40a includes a notch portion 40f to guide a flexible print board 41.

Figure 37:
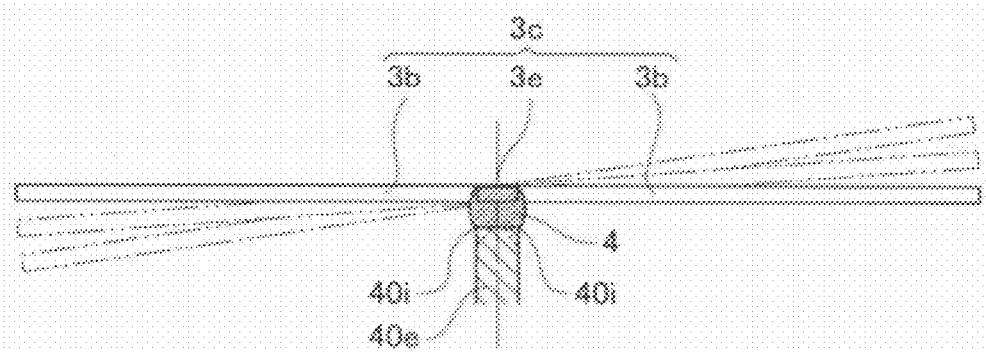
FIG. 37 is an enlarged cross section view of the actuator set with the protective cover in a traverse direction to the rotary axis of the meander beam elements to show the meander beam elements held in walls.

The protective cover 40 is made from plastic such as transparent acrylic resin. The top portions 40g of the supporting walls 40e are coated with the gel material of the damper elements 4 before the actuator 30 is set with the protective cover 40. The damper elements 4 are held between the supporting walls 40e and the meander beam elements 3c as shown in FIG. 37.

With use of an ultraviolet curable material for the damper elements 4, the material can be cured by ultraviolet irradiation through the space 3c" between the straight portions 3b. With use of an ultraviolet permeable material for the protective cover 40, ultraviolet is irradiated to the material via the face of the bottom wall 40b of the protective cover 40.

Thus, since the viscosity of the damper elements 4 acts on both the meander beam elements 3c and the supporting walls 40e, the damper elements 4 can be easily positioned as well as they are prevented from being displaced from the rotary axis O during use of the actuator 30.

Figure 38:
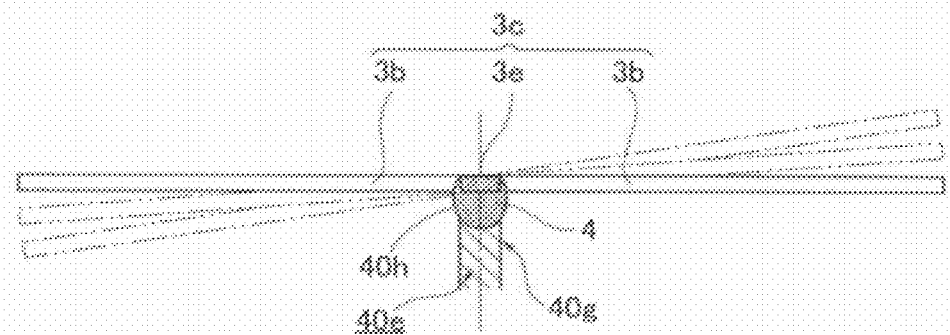
FIG. 38 is an enlarged cross section view of another example of the meander beam elements held in walls in FIG. 37.

The top portions 40g of the supporting walls 40e can be depressions 40h to prevent the damper elements 4 from dropping off as shown in FIG. 38.

Figure 39:
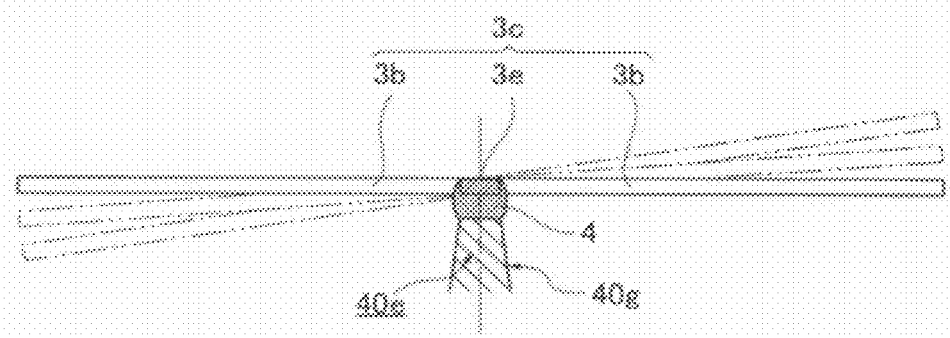
FIG. 39 is an enlarged cross section view of another example of the meander beam elements held in walls in FIG. 37.

Moreover, to prevent the supporting walls 40e from being damaged during use, they can be formed in a shape to change in width from narrow to wide, from the top portions 40g to the bottom wall 40b as shown in FIG. 39.

Alternatively, the edges of the top portions 40g can be chamfered (ridge line 40i) to adjust the width of the top portions 40g, as indicated a broken line in FIG. 37. To shape the supporting walls 40e as above, the separate two parts, the supporting walls 40e and the bottom wall 40b are prepared, and bonded together to form the protective cover 40 after the supporting walls 40e are machined.

Figure 40:
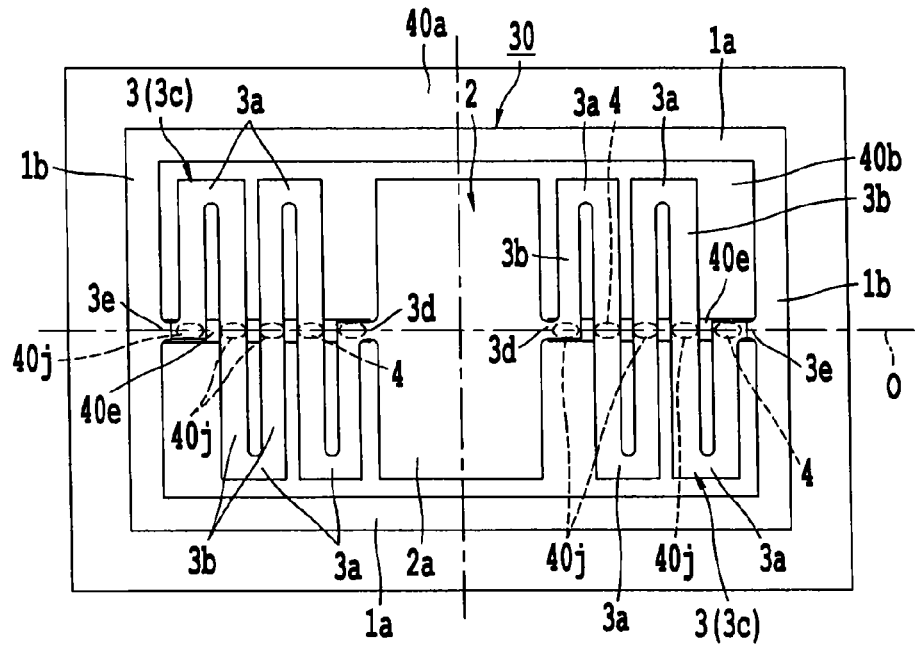
FIG. 40 is a plan view of the actuator set with the protective cover, showing another example of the position of the damper elements.

Moreover, the meander beam elements 3c are softly held on the supporting walls 40e of the protective cover 40 via the damper elements 4 so that all the space 3c" between the straight portions 3b of the meander beam elements does not need to be connected by the damper elements 4, as shown in FIGS. 15-18. Instead, as shown in FIG. 40, for example, the damper elements 4 can be intermittently disposed only on intersections 40j of the straight portions 3b and the supporting walls 40e on the rotary axis O.

Figure 41:
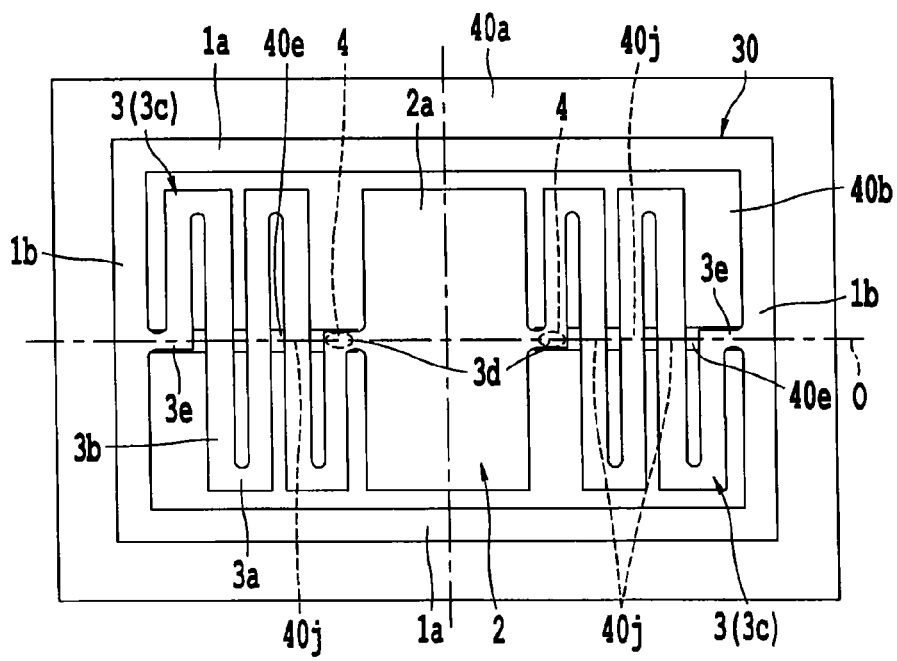
FIG. 41 is a plan view of another example of the position of the damper elements.

Moreover, the damper elements 4 may not be disposed on all of the intersections 40j depending on the weight or shape of the movable element 2. For example, they can be only on the connecting shafts 3d between the movable element 2 and the meander beam elements 3c in FIG. 41 or on the intersections 40j between the connecting shafts 3d near the movable element 2 or the straight portions 3b near these connecting shafts 3d and the supporting walls 40e.

Figure 42:
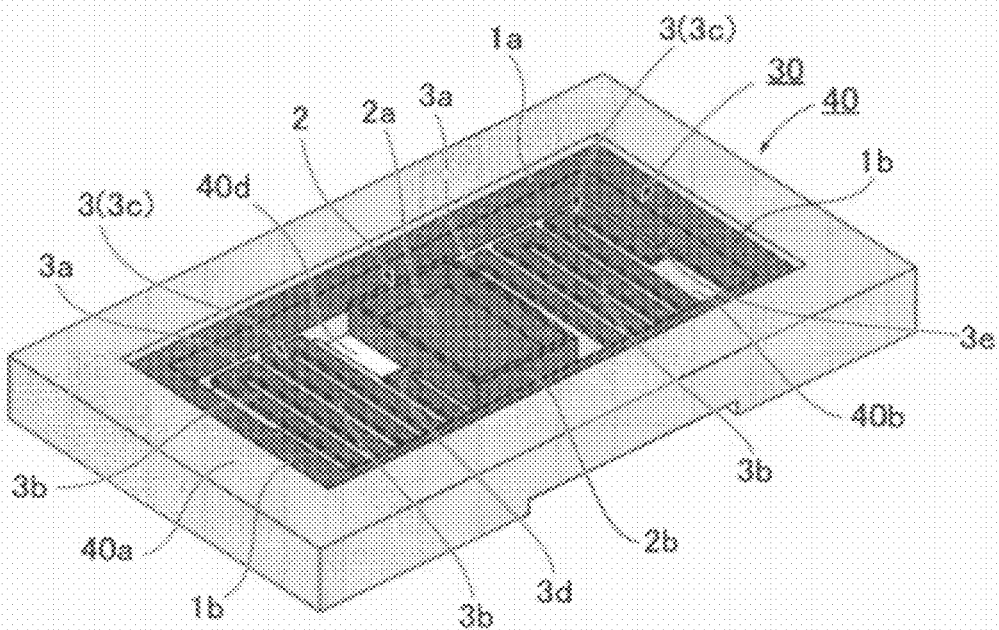
FIG. 42 is a perspective view of the back side of the actuator set with the protective cover.

Further, the protective cover 40 can be set on the back face of the actuator 30 as shown in FIG. 42 instead of the front face in FIG. 35.

Thus, the protective cover 40 for actuator is configured of the surrounding wall 40a around the actuator 30 and the supporting walls 40e for the damper elements 4. Therefore, it can prevent the damper elements 4 from being displaced from the rotary axis O during use of the actuator 30.

Fifteenth Embodiment

Figure 43:
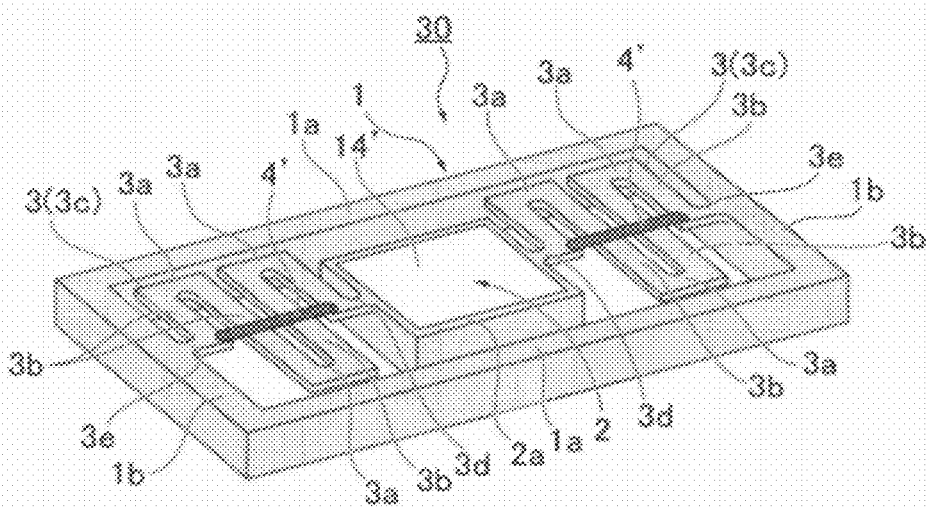
FIG. 43 is a perspective view of an example of an optical deflector incorporating the actuator according to the present invention which includes a plate portion with a reflective face.

FIG. 43 shows an example of using the actuator 30 for an optical deflector which additionally includes a reflective mirror 14' on the plate portion 2a of the movable element 2. The reflective mirror 14' is formed by vacuum evaporating aluminum on the plate portion 2a, for example. The reflective mirror 14' is moved by the rotation of the movable element 2 to reflect incident light in different directions. Thus, the actuator 30 can be used for an optical deflector or an optical scanner.

Owing to the damper elements 4 on the rotary axis O of the connecting shafts 3d, 3e, the beam elements 3 can be prevented from being largely deformed by an impact or impulsive force. A reliable optical deflector or actuator 30 can be provided.

Sixteenth Embodiment

Figure 44:
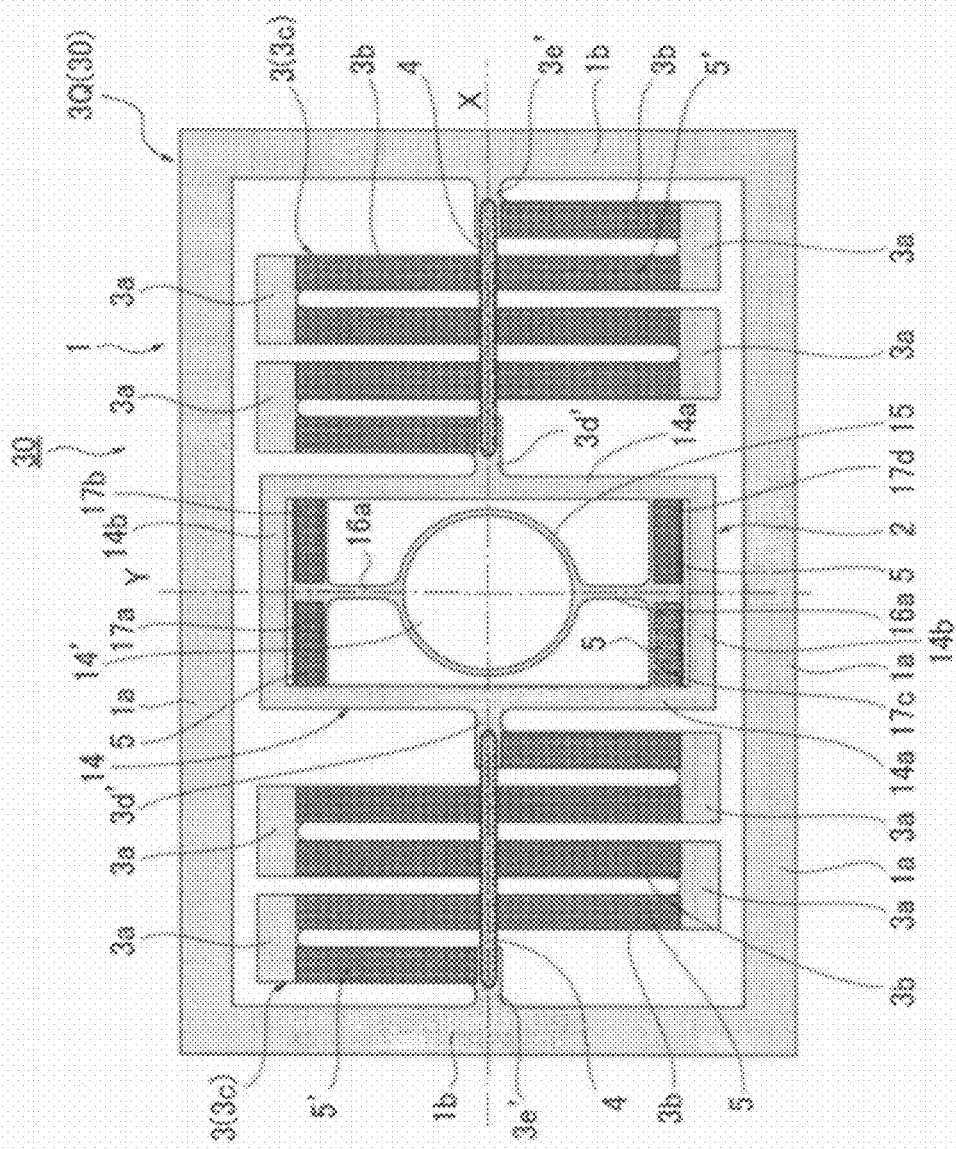
FIG. 44 is a plan view of a two dimensional optical scanner in which the actuators according to the present invention is arranged in a nested structure.

FIG. 44 shows an example of a two dimensional optical scanner to which the actuator 30 is applied. A two dimensional optical scanner 3Q includes a rectangular outer frame element 1 and the movable element 2 having a rectangular inner frame element 14 which includes long frame portions 14a and short frame portions 14b.

The long frame portions 14a extend in parallel to the short frame portions 1b while the short frame portions 14b extend in parallel to the long frame portions 1a. The inner frame element 14 includes a movable plate 15 in a disc shape on which the reflective mirror 14' is formed.

The movable plate 15 is supported by beam elements 16a extending in diameter direction. The extending direction of the beam elements 16a is defined to be Y axis. The ends of the beam elements are integrated with four cantilevers 17a to 17d.

The four cantilevers 17a to 17d extend in a direction orthogonal to the beam elements 16a and the ends of the cantilevers 17a to 17d are integrated with the long frame portions 14a. The cantilevers 17a to 17d can be made from bimorph, monomorph, bimetal, or shape-memory alloy. In the present embodiment the piezoelectric films 5 are used for the cantilevers 17a to 17d.

Bending force generated from the cantilevers 17a to 17d is transmitted to the beam elements 16a, which rotates the movable plate 15 around the beam elements 16a as the rotary axis in Y-axis direction.

The meander beam elements 3c are provided between the long frame portions 14a and the short frame portions 1b and include the turnback portions 3a and the straight portions 3b. Piezoelectric films 5' are formed on the straight portions 3b.

The turnback portions 3a extend in parallel to the long frame portions 1a and the straight portions 3b extend in parallel to the short frame portions 1b. The meander beam elements 3c include connecting shaft 3e' connecting the meander beam elements 3c to the short frame portions 1b and connecting shafts 3d' connecting the meander beam elements 3c to the long frame portions 14a.

The straight lines connecting the connecting shafts 3d' and 3e' are parallel to the long frame portions 1a and orthogonal to the Y axis. The extending direction of the straight lines is defined to be X axis. The straight lines are the rotary axis in X-axis direction. The damper elements 4 are provided on the rotary axis.

Upon driving the piezoelectric films 5 on the straight portions 3b, each of the straight portions 3b is finitely moved and accumulated movements of all the straight portions 3b largely rotate the movable element 2 in the X-axis direction.

Along the rotation of the movable element 2 around the X axis, an incident beam of light is deflected in Y-axis direction. Along the rotation of the movable plate 15 in Y-axis direction, an incident beam of light is deflected in X-axis direction. Thus, a beam of light is two-dimensionally scanned.

Thus, the movable element 2 is placed in a nested state so that it is rotated at high speed around the Y axis by resonance of the cantilevers 17a to 17d with high spring stiffness and rotated around the X axis at low resonance frequency by resonance of the meander beam elements 3c with low spring stiffness. Thereby, the two dimensional optical scanner 3Q can generate raster images with light beams by small power supply from a large difference in resonance frequency between the Y-axis rotation and X-axis rotation or a small spring resistance force when resonance characteristic is not usable.

The damper elements 4 are arranged in the two dimensional optical scanner 3Q using the position marks as follows. For example, the position marks Ma can be concurrently formed with wirings Mx using a part of the wirings Mx. The wirings Mx are laid on the meander beam elements 3c connecting the outer frame element 1 and the inner frame element 14 as the movable element 2, for supplying driving power to the piezoelectric films 5 on the cantilevers 17a to 17d as shown in FIG. 45.

Figure 45:
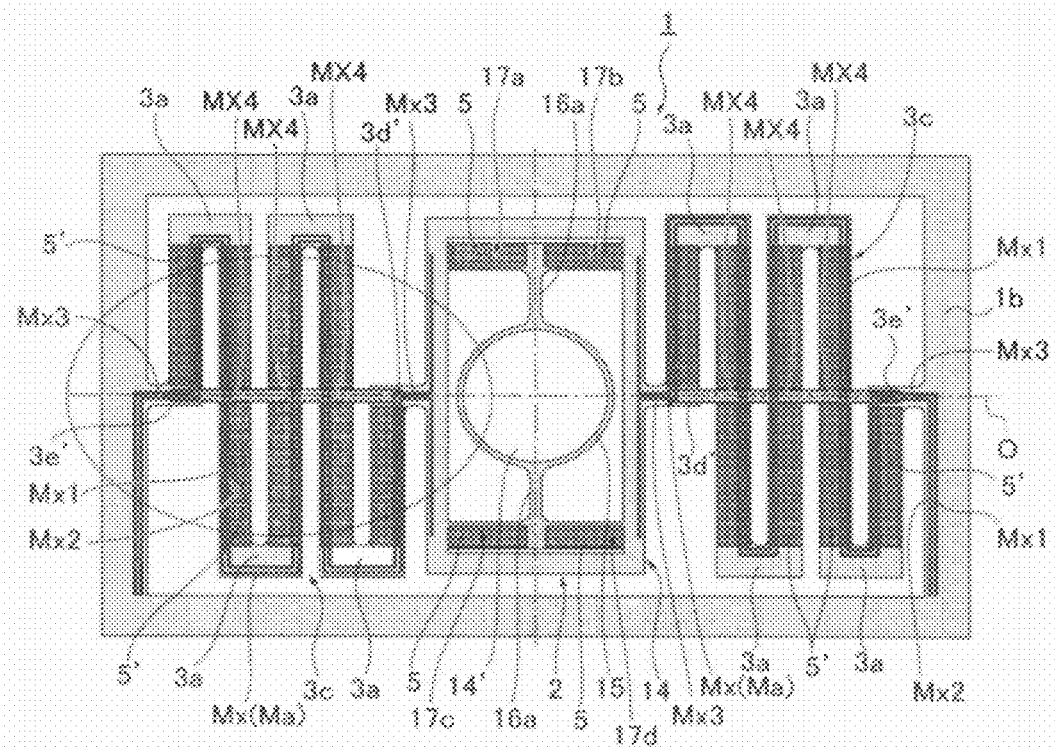
FIG. 45 is plan view of the actuator in which position marks are formed using wiring laid on the meander beam elements.
Figure 46:
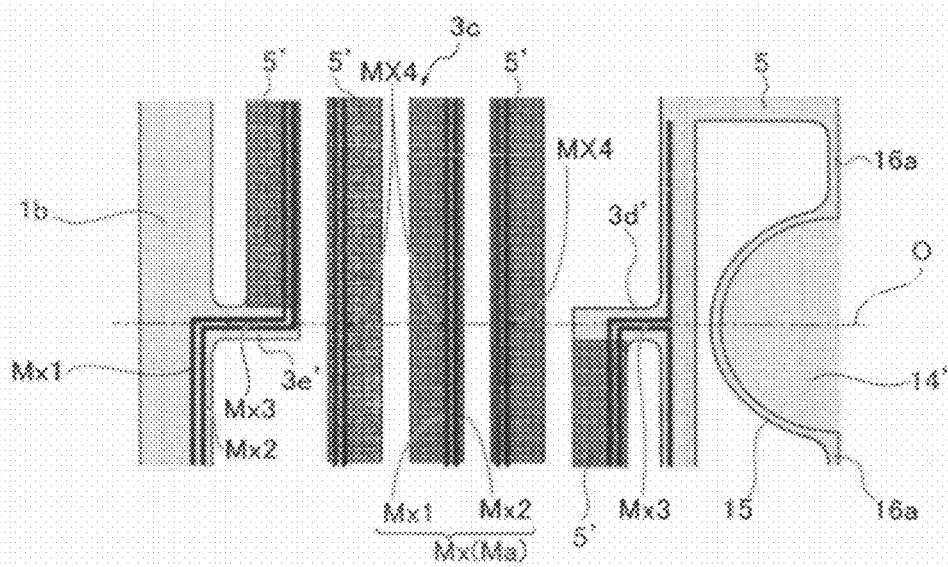
FIG. 46 is an enlarged view of a part of the wiring in FIG. 45.

FIG. 46 is an enlarged partial view of the wirings Mx on the meander beam elements 3c in FIG. 45 which are comprised of first aluminum wirings Mx1 and second aluminum wirings Mx2.

By the first and second wirings, gap lines Mx3 extending along the rotary axis O on the connecting shafts 3d', 3e' of the meander beam elements 3c and mark lines Mx4 extending in a direction orthogonal to the longitudinal direction of the straight portions 3b are formed.

According to the present embodiment, the position marks Ma for the rotary axis can be efficiently formed on the meander beam elements 3c using the wirings Mx, concurrently with the layout of the wirings Mx on a silicon face, for example to supply electric power to a driver means.

The present embodiment has described an example where the position marks Ma are formed using the wirings Mx. However, they can be arbitrarily formed and the present invention should not be limited to such an example.

Seventeenth Embodiment

Figure 47:
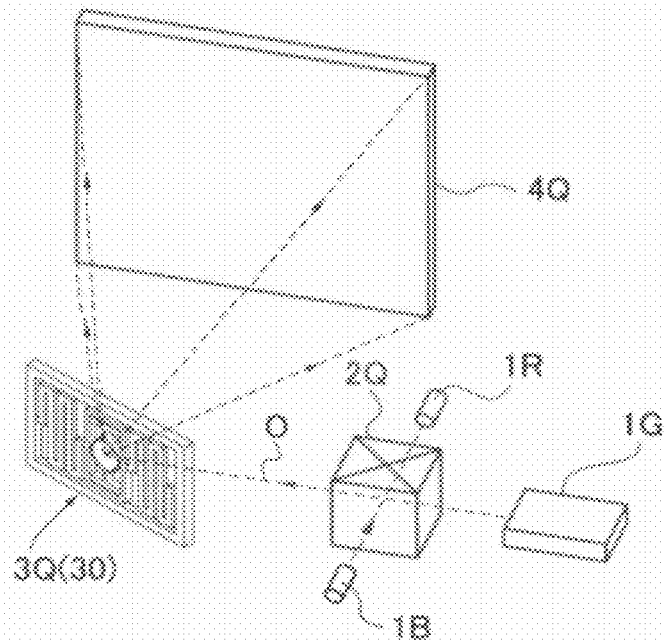
FIG. 47 is a perspective view of the structure of an image projector incorporating the two dimensional optical scanner in FIG. 44 by way of example.

FIG. 47 shows an example of an image projector incorporating the two dimensional optical scanner 3Q in FIG. 46. An image projector includes a first light source 1R to emit a red laser beam, a second light source 1G to emit a green laser beam, a third light source 1B to emit a blue laser beam, a crossdichroic prism 2Q and the two dimensional optical scanner 3Q to scan a laser beam output from the crossdichroic prism 2Q to project an image onto a projector screen 4Q. The image projector can be integrated with the projector screen 4Q.

The first light source 1R is a semiconductor laser diode with the center wavelength of about 630 nm, the third light source 1B is the same with the center wavelength of about 430 nm, and the second light source 1G is a laser device with the center wavelength of about 540 nm.

The two dimensional optical scanner 3Q is configured to be able to rotate around the two axes to reflect a laser beam to the projector screen 4Q. The reflective mirror of the two dimensional optical scanner 3Q can be oscillated in two directions to scan a laser beam onto the projector screen 4Q in vertical and horizontal directions. Accordingly, the image projector can display desired images on the screen by adjusting the light amount of the three color laser beams in accordance with a projection position.

Figure 48:
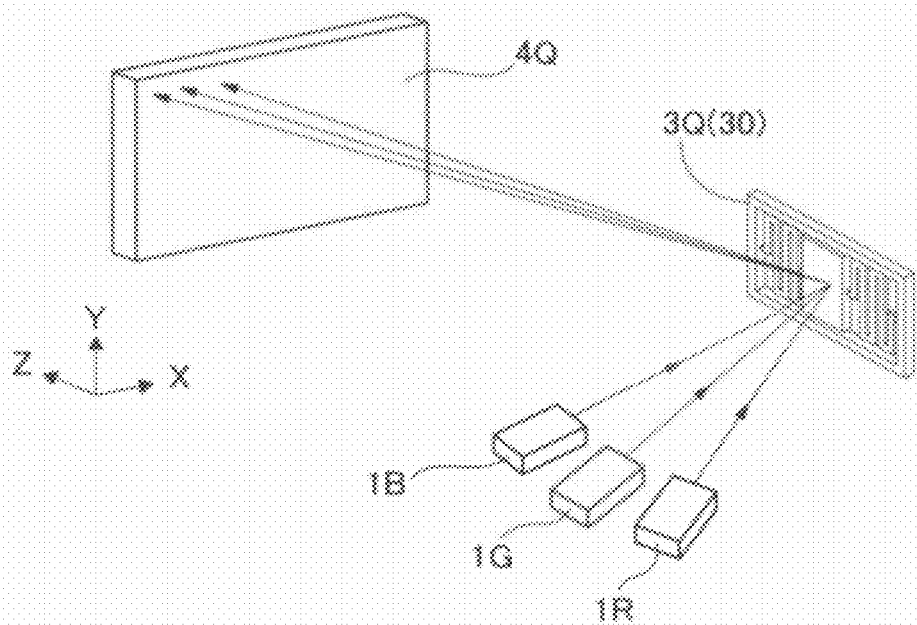
FIG. 48 a perspective view of another example of an image projector incorporating the two dimensional optical scanner in FIG. 44

Alternatively, the image projector can be configured that the optical paths of the first to third laser sources 1R, 1G, 1B are not combined, as shown in FIG. 48. The present embodiment has described a color image projector by way of example; however, the two dimensional optical scanner 3Q is also applicable to a monochrome image projector.

Further, the two dimensional optical scanner 3Q is configured of the actuator 30 in FIG. 43 in a nested structure. However, the actuators 30 shown in FIGS. 9 to 24 can be arbitrarily combined to form a nested structure.

According to one embodiment of the present invention, since the damper elements are formed on the rotary axis of both beam elements connecting the movable element to the frame element, they do not affect the normal rotation of the movable element and can prevent the beam elements from being largely deformed upon receiving an impact. As a result, the actuator can be prevented from being damaged. Even with the beam elements in a thin and long shape for the purpose of rotating with low frequency and by small driving force, they can be prevented from largely deformed by an impact, for example.

According to one embodiment of the present invention, the piezoelectric film formed on the beam elements is the one to deform the beam elements so that the actuator can be prevented from being damaged by an impact, even with the movable element given the rotary oscillation.

According to one embodiment of the present invention, with provision of the impact reducing element on the movable element, the impact reducing element can absorb an impact from the movable element's hitting another element for any reason. Therefore, the actuator can be further prevented from being broken down.

According to one embodiment of the present invention, the damper elements are formed on the back faces of the beam elements and do not protrude from the front faces. This can improve the degree of freedom for design and work in subsequent processes.

According to one embodiment of the present invention, the concaves to guide the discharge needle are formed on the walls of the frame element and the movable element, which enables the damper elements to be formed on the back faces of the beam elements without enlarging the size of the actuator.

According to one embodiment of the present invention, the damper elements can be precisely formed on the beam elements, using a gel material.

According to one embodiment of the present invention, the optical deflector oscillating with low frequency by a small driving force can be provided.

According to one embodiment of the present invention, the two dimensional optical scanner can be prevented from being broken down due to an impact from the element driving at low frequency. It does not need a large space for preventing the breakdown, and the degree of freedom in which the two dimensional optical scanner is designed can be improved.

According to one embodiment of the present invention, the image projector incorporating the reliable, downsized optical scanner can also be downsized and improved in performance.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. An actuator comprising:
   a frame element;
   a pair of beam elements with first ends connected to the frame element;
   a movable element rotatably supported by the frame element via the beam elements, second ends of the beam elements being connected to the movable element;
   a driver configured to rotate the movable element relative to the frame element around the beam elements as a rotary shaft such that the beam elements rotate about a rotary axis; and
   damper elements provided on the beam elements between the first and second ends thereof and extending along the rotary axis,
   wherein the beam elements are formed in a meander shape and include turnback portions, straight portions, a first connecting shaft connected with the frame element, and a second connecting shaft connected with the movable element,
   wherein the damper elements are disposed on a straight line connecting the first and second connecting shafts as the rotary axis to connect discontinuous spaces of the meander beam elements, and
   wherein the discontinuous spaces between the straight portions of the meander beam element are connected on the rotary axis by the damper element.

2. An actuator according to claim 1, wherein an elasticity of the damper is less than an elasticity of the beam elements.

3. An actuator according to claim 1, wherein
   the damper elements are formed on back faces of the beam elements.

4. An actuator according to claim 3, wherein
   the frame element and the movable element each include a concave in a wall portion to provide a space for use in forming the damper elements.

5. A protective cover for the actuator according to claim 1, comprising:
   a surrounding wall to surround the actuator and a supporting wall to support the damper elements.

6. An actuator according to claim 1, wherein
   the movable element includes an impact reducing element made from a same material as that of the damper elements.

7. An actuator according to claim 1, wherein:
   the movable element is made up of a plate portion and a reinforcing wall; and
   the plate portion includes an impact reducing element made from a same material as that of the damper elements.

8. An actuator according to claim 1, wherein
   the meander beam elements each include, at a position on the rotary axis, a position mark for pattern recognition of the rotary axis.

9. An actuator according to claim 8, wherein
   the position mark is formed, using a wiring laid out on the meander beam elements to supply drive power to the driver.

10. An actuator according to claim 1, further comprising
    piezoelectric films and electrodes formed on the straight portions, respectively, the piezoelectric films to bend the straight portions, the electrodes to apply a drive voltage to the piezoelectric films, wherein
    the movable element is rotated by accumulated bending of the respective straight portions by an applied drive voltage.

11. An optical deflector comprising the actuator according to claim 1, wherein
    the movable element includes a reflective face; and
    the movable element is rotated to reflect an incident light beam in different directions.

12. A two dimensional optical scanner comprising the actuator according to claim 1, wherein:
    the actuator has a nested structure;
    the movable element includes a reflective face; and
    the movable element is rotated in two axial directions orthogonal to each other to reflect an incident light beam in different directions for scanning in two different directions orthogonal to each other.

13. An image projector comprising the two dimensional optical scanner according to claim 12, to form an image on a projection plane using the two dimensional optical scanner.

14. A manufacturing method for the actuator according to claim 1, comprising:
    fitting a mold for the damper elements into the frame element and pouring a gel material into the mold;
    detaching the mold from the frame element after the gel material is cured to form the damper elements on the beam elements.

15. A manufacturing method for the actuator according to claim 1, comprising:
    extending a bar element with tension and with a gap on the rotary axis of the meander beam elements;
    placing a gel material into contact with the meander beam elements and the bar element;
    curing the gel material to form the damper elements; and
    detaching the bar element from the damper elements.

16. A manufacturing method for the actuator according to claim 1, comprising:
    forming the damper elements on the beam elements while the frame element is inclined relative to a horizontal plane.

17. A manufacturing method for the actuator according to claim 1, comprising:
    curing a gel material to form a damper material; and
    applying the damper material onto the beam elements to form the damper elements.

* * * * *